US012672229B2

(12) United States Patent
Buchling Rego et al.

(10) Patent No.: US 12,672,229 B2
(45) Date of Patent: Jun. 30, 2026

(54) TAMPER-RESPONDENT ASSEMBLIES WITH INDIVIDUALIZED CHEMICAL MIXTURES FOR SECURITY

(71) Applicant: INTERNATIONAL BUSINESS MACHINES CORPORATION, Armonk, NY (US)

(72) Inventors: Philipp K. Buchling Rego, Wappingers Falls, NY (US); Madhana Sunder, Meridian, ID (US); Conor Ryan Thomas, Woodbury, CT (US); Joyce E. Molinelli Acocella, Poughquag, NY (US); William L. Brodsky, Binghamton, NY (US); William Santiago-Fernandez, Hopewell Junction, NY (US); Michael Fisher, Poughquag, NY (US); James Busby, New Paltz, NY (US); Arthur J. Higby, Cottekill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 329 days.

(21) Appl. No.: 18/467,060

(22) Filed: Sep. 14, 2023

(65) Prior Publication Data

US 2025/0098061 A1     Mar. 20, 2025

(51) Int. Cl.
*H05K 1/02* (2006.01)

(52) U.S. Cl.
CPC . *H05K 1/0275* (2013.01); *H05K 2201/10151* (2013.01)

(58) Field of Classification Search
CPC ................... H05K 1/0275; H05K 2201/10151
(Continued)

(56) References Cited

U.S. PATENT DOCUMENTS 5,586,049 A    12/1996  Kurtzberg et al.
6,185,507 B1    2/2001  Huber et al.
(Continued)

FOREIGN PATENT DOCUMENTS

AU    2006/248151 B2    11/2006
CN       101180663 A     5/2008

OTHER PUBLICATIONS

Anonymous, "Cryptographic Hardware Security Module with Enhanced Cooling and Tamper Detection Using Dielectric Fluid Within the Secure Enclosure", IP.COM No. IPCOM000267135D, published Sep. 28, 2021 (5 pages) (Year: 2021).
(Continued)

*Primary Examiner* — Binh B Tran
(74) *Attorney, Agent, or Firm* — Tihon Poltavets, Esq; Kevin P. Radigan, Esq.; Heslin Rothenberg Farley & Mesiti P.C.

(57) ABSTRACT

Tamper-respondent assemblies are provided which include individualized fluid chemical mixtures for tamper detection. The tamper-respondent assemblies include, for instance, a circuit board and an enclosure. The circuit board includes an electronic component, and the enclosure is mounted to the circuit board to enclose the electronic component within a secure volume, where the secure volume is a sealed space. A fluid is disposed within the secure volume that includes a chemical mixture of multiple chemical substances, and the multiple chemical substances have randomly generated concentrations within the chemical mixture. One or more sensors are provided to facilitate detecting a change in the chemical mixture of the fluid within the secure volume indicative of a tamper event.

18 Claims, 14 Drawing Sheets

(58) Field of Classification Search
USPC ............................................................ 361/748
See application file for complete search history.

(56) References Cited

U.S. PATENT DOCUMENTS

| | | | |
|---|---|---|---|
| 6,233,339 B1 | 5/2001 | Kawano et al. | |
| 8,345,423 B2 * | 1/2013 | Campbell | F28D 15/0233 |
| | | | 257/714 |
| 8,665,083 B2 | 3/2014 | Easley et al. | |
| 9,881,184 B2 | 1/2018 | Allyn | |
| 9,904,811 B2 * | 2/2018 | Campbell | G06F 21/86 |
| 9,916,744 B2 | 3/2018 | Busby et al. | |
| 10,143,090 B2 | 11/2018 | Brodsky et al. | |
| 11,113,428 B1 | 9/2021 | Totah et al. | |
| 11,716,808 B2 | 8/2023 | Zhang et al. | |
| 2008/0106605 A1 | 5/2008 | Schrijen et al. | |
| 2010/0198183 A1 * | 8/2010 | Lanigan | H01Q 9/265 |
| | | | 604/406 |
| 2016/0203344 A1 | 7/2016 | Fink et al. | |
| 2023/0117486 A1 | 4/2023 | Rokhsaz et al. | |
| 2023/0130104 A1 | 4/2023 | Iruvanti et al. | |

OTHER PUBLICATIONS

FUJI Electric, "Three Phase Encapsulated Type SF6 Gas Insulated Switchgear", Product Brochure, downloaded from: https://www.fujielectric.com/products/transmission_distribution/box/doc/06B1-E-0001.pdf (6 pages) (Year: 2013).

Honeywell, "Board Mount Pressure Sensors: Basic ABP2 Series", Product Brochure, downloaded from: https://sps.honeywell.com/us/en/products/advanced-sensing-technologies/healthcare-sensing/board . . . (2 pages) (Year: 2023).

Nenvitech, "IREF-LITE: The Revolutionary Low-Cost, NDIR-Based Sensor Series for A2L Refrigerant Leak Detection", Product Brochure, downloaded from: https://www.nenvitech.com/products/ndir-sensors/iref-lite/ (5 pages) (Year: 2023).

Sensirion, "SGP4x Gas Sensors—SGP40 VOC Sensor", Product Brochure, downloaded from: https://developer.sensirion.com/sensirion-products/sgp4x-gas-sensors/ (7 pages) (Year: 2023).

* cited by examiner

500"

520

552

550

552

502

110'

502"

531

522

530

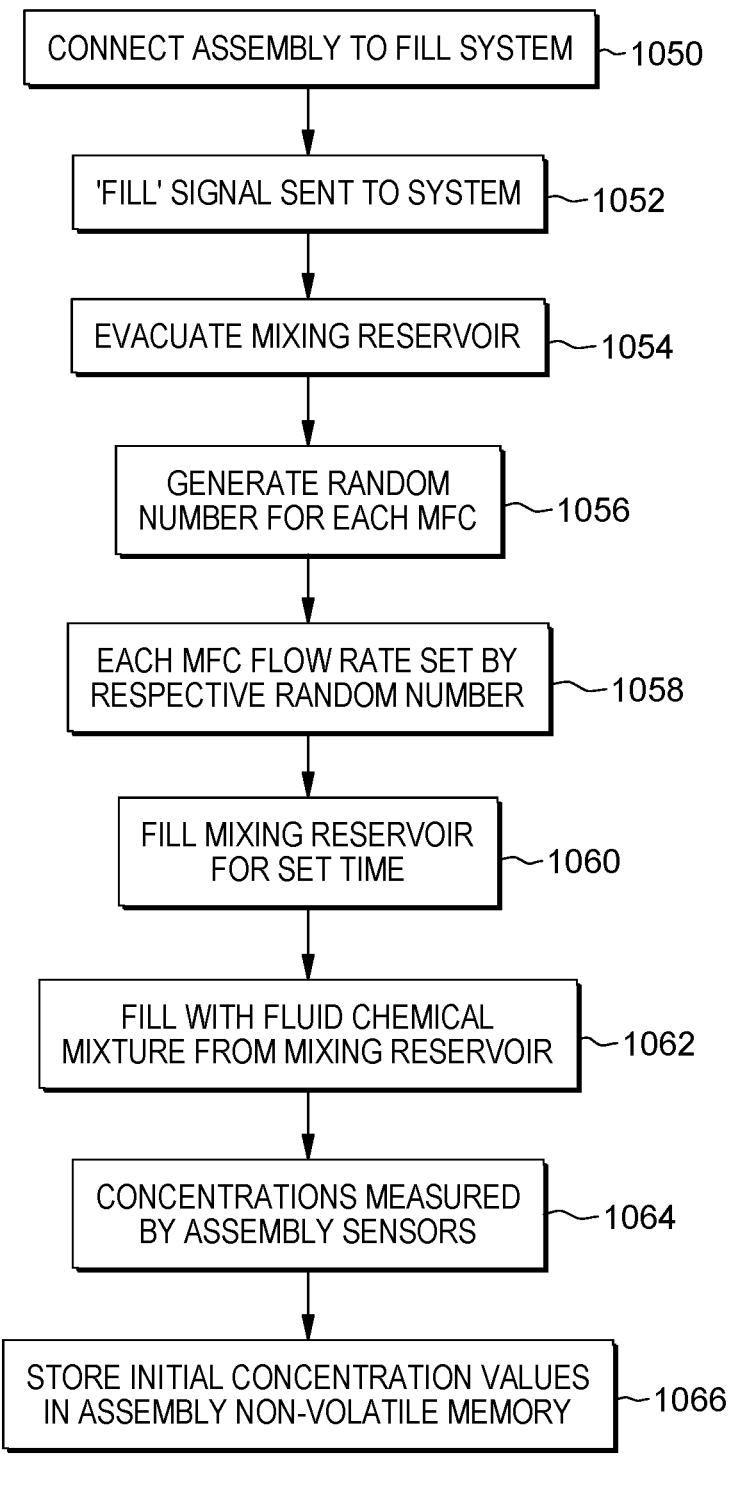

CONNECT ASSEMBLY TO FILL SYSTEM ~1050

'FILL' SIGNAL SENT TO SYSTEM ~1052

EVACUATE MIXING RESERVOIR ~1054

GENERATE RANDOM NUMBER FOR EACH MFC ~1056

EACH MFC FLOW RATE SET BY RESPECTIVE RANDOM NUMBER ~1058

FILL MIXING RESERVOIR FOR SET TIME ~1060

FILL WITH FLUID CHEMICAL MIXTURE FROM MIXING RESERVOIR ~1062

CONCENTRATIONS MEASURED BY ASSEMBLY SENSORS ~1064

STORE INITIAL CONCENTRATION VALUES IN ASSEMBLY NON-VOLATILE MEMORY ~1066

FIG. 10B

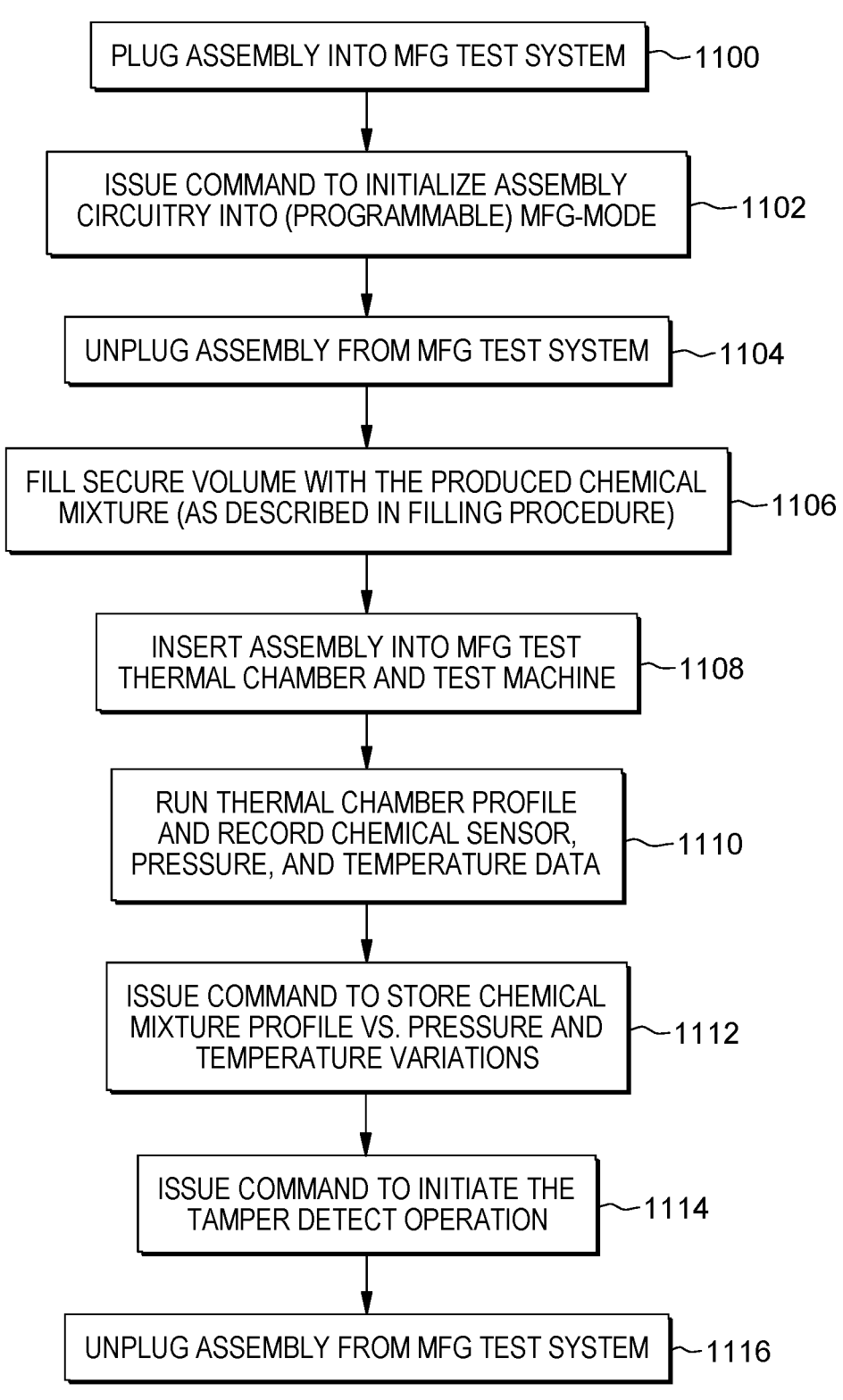

PLUG ASSEMBLY INTO MFG TEST SYSTEM ~1100

ISSUE COMMAND TO INITIALIZE ASSEMBLY CIRCUITRY INTO (PROGRAMMABLE) MFG-MODE ~1102

UNPLUG ASSEMBLY FROM MFG TEST SYSTEM ~1104

FILL SECURE VOLUME WITH THE PRODUCED CHEMICAL MIXTURE (AS DESCRIBED IN FILLING PROCEDURE) ~1106

INSERT ASSEMBLY INTO MFG TEST THERMAL CHAMBER AND TEST MACHINE ~1108

RUN THERMAL CHAMBER PROFILE AND RECORD CHEMICAL SENSOR, PRESSURE, AND TEMPERATURE DATA ~1110

ISSUE COMMAND TO STORE CHEMICAL MIXTURE PROFILE VS. PRESSURE AND TEMPERATURE VARIATIONS ~1112

ISSUE COMMAND TO INITIATE THE TAMPER DETECT OPERATION ~1114

UNPLUG ASSEMBLY FROM MFG TEST SYSTEM ~1116

FIG. 11

TAMPER-RESPONDENT ASSEMBLIES WITH INDIVIDUALIZED CHEMICAL MIXTURES FOR SECURITY

BACKGROUND

The present disclosure relates in general to the field of electronics, and more particularly, to tamper-proof electronic packaging.

Many activities require secure electronic communications. To facilitate secure electronic communications, an encryption/decryption system can be implemented on an electronic assembly or circuit board assembly that is included in equipment connected to a communications network. Such an electronic assembly is an enticing target for malefactors since it may contain codes or keys to decrypt intercepted messages, or to encode fraudulent messages. To prevent this, the electronic assembly can be mounted in an enclosure, which in one approach can then be wrapped in a security sensor and encapsulated with polyurethane resin. The security sensor can be, in one or more embodiments, a web or sheet of insulating material with circuit elements, such as closely-spaced, conductive lines fabricated on it. The circuit elements are disrupted if the sensor is torn during a tamper event, with the tear being sensed by a monitor circuit to reveal the attack on the integrity of the assembly, triggering an erasure by the monitor circuit of encryption/decryption keys stored within the electronic assembly.

SUMMARY

Certain shortcomings of the prior art are overcome, and additional advantages are provided herein through the provision, in one or more aspects, of a tamper-respondent assembly which includes a circuit board and an enclosure. The circuit board includes an electronic component, and the enclosure is mounted to the circuit board to enclose the electronic component within a secure volume, where the secure volume is a sealed space. In addition, the tamper-respondent assembly includes a fluid disposed within the secure volume. The fluid includes a chemical mixture with multiple chemical substances. The multiple chemical substances have randomly generated concentrations within the chemical mixture. In addition, the tamper-respondent assembly includes one or more sensors to facilitate detecting a change in the chemical mixture of the fluid within the secure volume indicative of a tamper event.

In another aspect, a tamper-respondent assembly is provided which includes a fluid disposed within a sealed space of the tamper-respondent assembly to secure, at least in part, an electronic component. The fluid includes a chemical mixture with multiple chemical substances, and the multiple chemical substances have randomly generated concentrations within the chemical mixture. In addition, the tamper-respondent assembly includes one or more sensors to facilitate detecting a change in the chemical mixture of the fluid indicative of a tamper event into the sealed space of the tamper-respondent assembly.

In a further aspect, a method of fabricating a tamper-respondent assembly is provided. The method includes obtaining a circuit board, where the circuit board includes an electronic component, and mounting an enclosure to the circuit board to enclose the electronic component within a secure volume. In addition, the method includes providing, via a fill port into the secure volume, a fluid within the secure volume. The fluid includes a chemical mixture with multiple chemical substances, where the multiple chemical substances have randomly generated concentrations within the chemical mixture. Further, the method of fabricating the tamper-respondent assembly includes providing one or more sensors to facilitate detecting a change in the chemical mixture of the fluid within the secure volume indicative of a tamper event.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 10B depicts one embodiment of a process for producing a unique chemical mixture for filling a secure volume of a tamper-respondent assembly, in accordance with one or more aspects of the present disclosure;

FIG. 11 depicts one embodiment of a process for filling and initializing tamper protection for a tamper-respondent assembly with a fluid having an individualized chemical mixture, in accordance with one or more aspects of the present disclosure;

DETAILED DESCRIPTION

Aspects of the present disclosure and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the disclosure in detail. It should be understood, however, that the detailed description and the specific example(s), while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application of the concepts disclosed.

Disclosed herein are certain novel tamper-respondent assemblies and methods of fabricating tamper-respondent assemblies to, for instance, facilitate secure electronic communications using encryption/decryption systems. In one or more implementations, various tamper-respondent assemblies and methods of fabrication are disclosed which facilitate providing, for instance, a security Level 4 sealed space, or secure volume for accommodating one or more electronic components, such as one or more encryption and/or decryption modules and associated components of, for instance, a communications card or other electronic assembly to be protected.

Figure 1A:
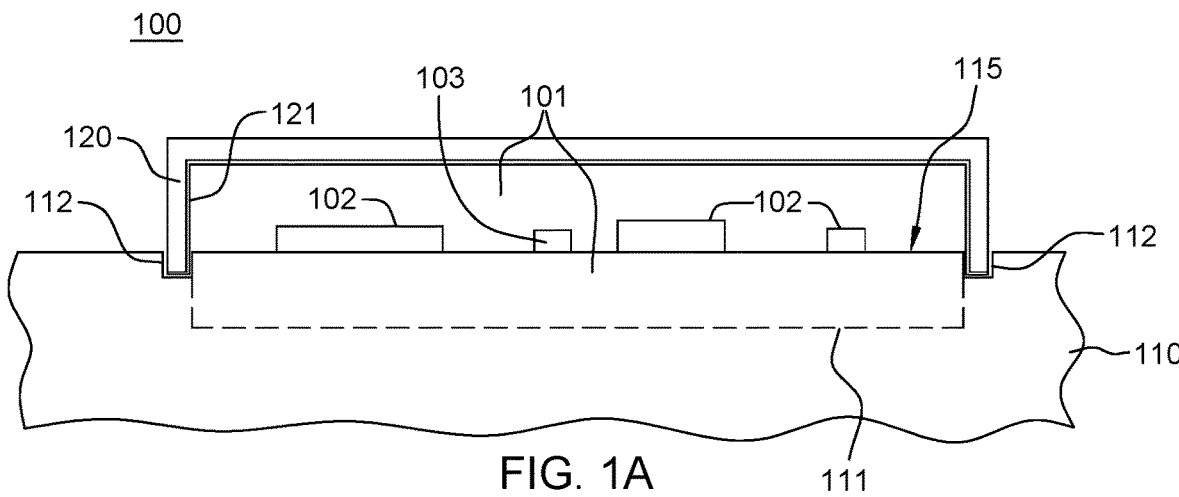
FIG. 1A is a cross-sectional elevational view of one embodiment of a tamper-proof electronic package, or tamper-respondent assembly, which can be modified in accordance with one or more aspects of the present disclosure.
Figure 1B:
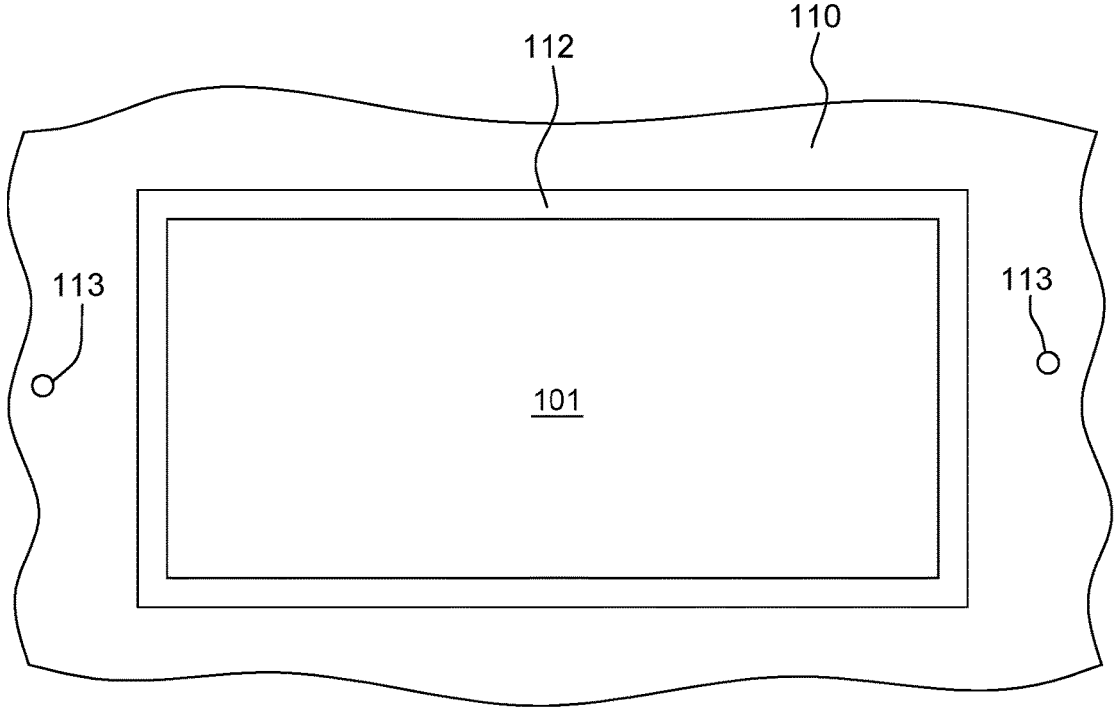
FIG. 1B is a top plan view of the multilayer circuit board of FIG. 1A.

Referring to FIGS. 1A & 1B, one embodiment of a tamper-proof electronic package or tamper-respondent assembly 100 is depicted, which includes one or more electronic components, such as a circuit 115 and/or electronic devices (or elements) 102 coupled to a multilayer circuit board 110.

Referring collectively to FIGS. 1A & 1B, circuit 115 resides on or is embedded within multilayer circuit board 110, which also has an embedded tamper-respondent sensor 111 that facilitates defining, in part, a secure volume 101 associated with multilayer circuit board 110 that (in one or more embodiments) extends into multilayer circuit board 110. In particular, in the embodiment of FIGS. 1A & 1B, secure volume 101 can exist partially within multilayer circuit board 110, and partially above multilayer circuit board 110. One or more electronic devices 102 are mounted to multilayer circuit board 110 within secure volume 101 and can include, for instance, one or more encryption modules and/or decryption modules, and/or associated components, to be protected within the tamper-proof electronic package. In one or more implementations, the one or more electronic components to be protected can include, for instance, components of a secure communications card of a computer system.

Tamper-respondent assembly 100 further includes an enclosure 120, such as a five-sided or pedestal-type enclosure, mounted to multilayer circuit board 110 within, for instance, a continuous groove (or trench) 112 formed within an upper surface of multilayer circuit board 110, and secured to the multilayer circuit board 110 via, for instance, a structural adhesive disposed within continuous groove 112. In one or more other implementations, enclosure 120 can be securely affixed to a surface of multilayer circuit board 110 (without a continuous groove) using, for instance, a bonding material such as an epoxy or other adhesive. In one or more embodiments, enclosure 120 can be made of a thermally conductive material to operate as a heat sink for facilitating cooling of the one or more electronic components within the secure volume.

In one approach, a security mesh or tamper-respondent sensor 121 can be associated with enclosure 120, for example, on the inner surface of enclosure 120, to facilitate defining, in combination with tamper-respondent sensor 111 embedded within multilayer circuit board 110, secure volume 101. In one or more other implementations, tamper-respondent sensor 121 is replaced in the tamper-respondent assemblies disclosed herein by incorporating a fluid with an individualized chemical security mixture within the secure volume, and one or more sensors to facilitate detecting a change in the chemical mixture of the fluid within the secure volume indicative of a tamper event, such as described below with reference to FIGS. 5-13.

Briefly described, in the embodiment of FIGS. 1A-1B, tamper-respondent sensor 121 can include, in one or more examples, one or more tamper-detection layers which include circuit lines or traces provided on one or both sides of, or within, a structural layer, which in one or more implementations, can be an insulating layer or film. The circuit lines can be of a line width and have a pitch or line-to-line spacing such that piercing of the layer at any point results in damage to one or more of the circuit lines or traces. In one or more implementations, the circuit lines can define one or more conductors which can be electrically connected in a network to a monitor circuit or detector 103, which monitors, for instance, sensor signals, such as resistance on the lines in the example of FIGS. 1A-1B. Detection of a change in resistance caused by cutting or damaging one or more of the lines, will cause information within the secure volume to be automatically erased. The conductive lines of the tamper-respondent sensor can be in any desired pattern, such as a sinusoidal pattern or a random pattern (as described further below), to make it more difficult to breach the tamper-detection layer without detection.

As depicted in FIG. 1B, one or more external circuit connection vias 113 can be provided within multilayer circuit board 110 for electrically connecting to the one or more electronic components within secure volume 101. These one or more external circuit connection vias 113 can electrically connect to one or more external signal lines or planes (not shown) embedded within multilayer circuit board 110 and extending, for instance, into a secure base region of (or below) secure volume 101. Electrical connections to and from secure volume 101 can be provided by coupling to such external signal lines or planes within the multilayer circuit board 110.

As noted, secure volume 101 is sized to house one or more electronic components to be protected and, in one or more embodiments, is constructed to extend into multilayer circuit board 110. In one or more implementations, multilayer circuit board 110 includes electrical interconnect within the secure volume 101 defined in the board, for instance, for electrically connecting one or more tamper-detection or security circuit layers of the embedded tamper-respondent sensor 111 to associated monitor circuitry also disposed within secure volume 101, along with, for instance, one or more daughter cards, such as memory DIMMs, PCIe cards, processor cards, or other electronic components, etc.

Note that the packaging embodiment depicted in FIGS. 1A & 1B is presented by way of example only. Other configurations of enclosure 120, or multilayer circuit board 110 can be employed, and/or other approaches to coupling enclosure 120 and multilayer circuit board 110 can be used.

Figure 2:
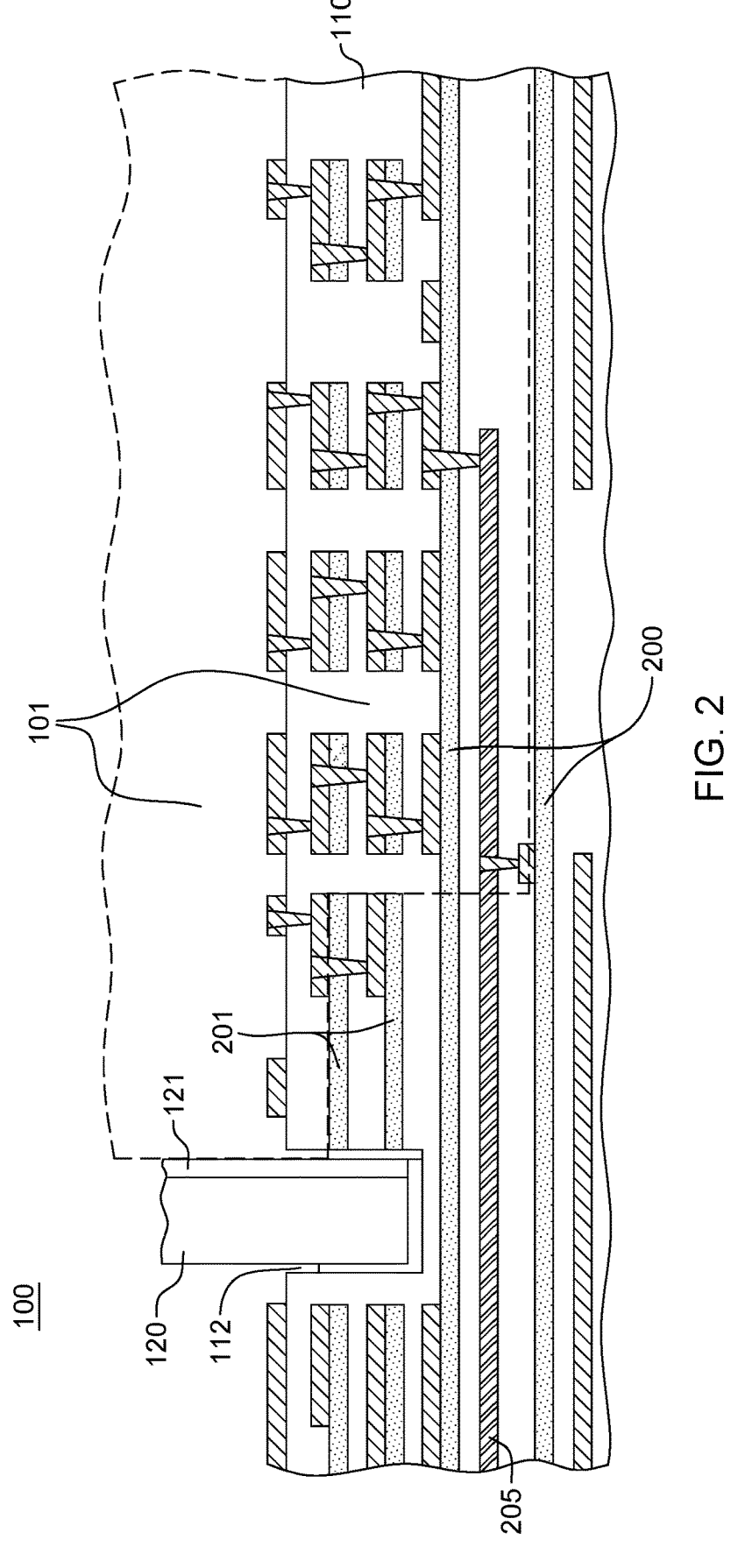
FIG. 2 is a partial cross-sectional elevational view of an embodiment of a tamper-respondent assembly with an embedded tamper-detect circuit within a multilayer circuit board, in accordance with one or more aspects of the present disclosure.

By way of further example, FIG. 2 depicts a partial cross-sectional elevational view of a more detailed embodiment of tamper-respondent assembly 100, and in particular, of multilayer circuit board 110, to which enclosure 120 is secured. In this configuration, the embedded tamper-respondent sensor includes multiple tamper-detection layers including, by way of example, at least one tamper-detection mat (or base) layer 200, and at least one tamper-detection frame 201. In the example depicted, two tamper-detection mat layers 200 and two tamper-detection frames 201 are illustrated, by way of example only. The lower-most tamper-detection mat layer 200 can be a continuous sense or detect layer extending completely below the secure volume being defined within and/or above multilayer circuit board 110. One or both tamper-detection mat layers 200 below secure volume 101 can be partitioned into multiple circuit zones, if desired. Within each tamper-detection mat layer, or more particularly, within each circuit zone of each tamper-detection mat layer, multiple circuits or conductive traces can be provided in any desired configuration. Further, the conductive traces within the tamper-detection layers can be implemented as, for instance, a resistive layer.

As illustrated, one or more external signal lines or planes 205 can enter secure volume 101 between, in one embodiment, two tamper-detection mat layers 200, and then electrically connect upwards into the secure volume 101 through one or more conductive vias, arranged in any desired location and pattern. By way of example only, the one or more tamper-detection frames 201 are disposed in FIG. 2 inside of the area defined by continuous groove 112 accommodating the base of enclosure 120. Together, tamper-detection frames 201 and tamper-detection mat layers 200 facilitate defining secure volume 101, which can extend, in part, into multilayer circuit board 110. With secure volume 101 defined, in part, within multilayer circuit board 110, the external signal line(s) 205 can be securely electrically connected to, for instance, the one or more electronic components mounted to, or of, multilayer circuit board 110 within secure volume 101. In addition, secure volume 101 can accommodate electrical interconnection of the conductive traces of the multiple tamper-detection layers 200, 201, for instance, via appropriate monitor circuitry.

Added security can be provided by extending tamper-detection mat layers 200 (and if desired, tamper-detection frames 201) outward past the periphery of enclosure 120. In this manner, a line of attack can be made more difficult at the interface between enclosure 120 and multilayer circuit board

110 since the attack would need to clear, for instance, tamper-detection mat layers 200, the enclosure 120, as well as the tamper-detection frames 201 of the embedded tamper-detect circuit.

Numerous variations on multilayer circuit board 110 of FIGS. 1A-2 are possible. For instance, in one embodiment, the embedded tamper-detect circuit can include one or more tamper-detection mat layers 200 and one or more tamper-detection frames 201, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, can be facilitated.

Figure 3:
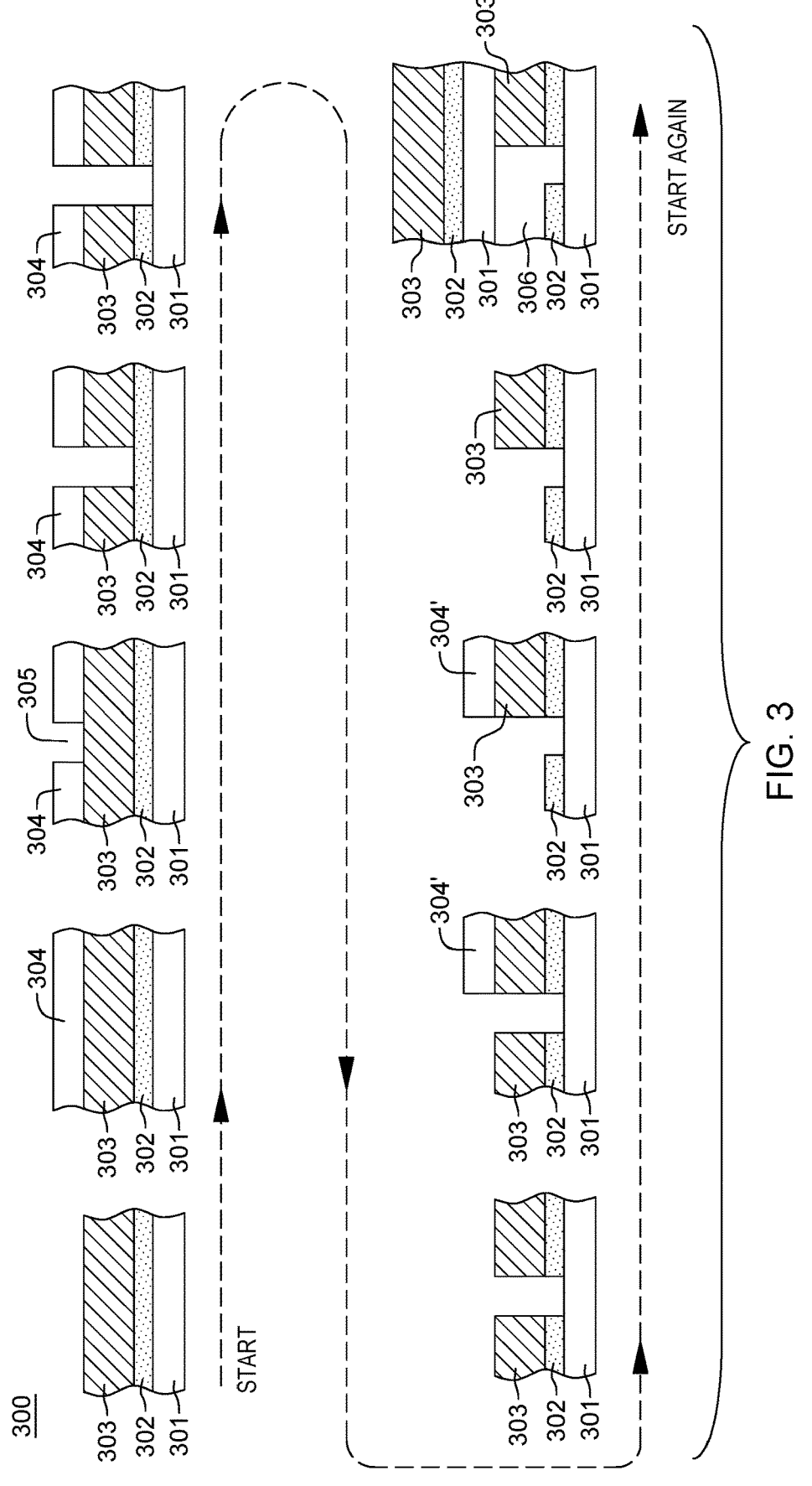
FIG. 3 depicts one embodiment of a process of fabricating a multilayer circuit board with an embedded tamper-detect circuit for a tamper-respondent assembly, in accordance with one or more aspects of the present disclosure.

In one or more implementations, the multilayer circuit board can be a multilayer wiring board or printed circuit board, or card, formed, for instance, by building up the multiple layers of the board. FIG. 3 illustrates one embodiment for forming and patterning a tamper-detection layer within such a multilayer circuit board.

As illustrated in FIG. 3, in one or more implementations, a tamper-detection layer, such as a tamper-detection mat layer or a tamper-detection frame disclosed herein, can be formed by providing a material stack comprising, at least in part, a structural layer 301, such as a pre-preg (or pre-impregnated) material layer, a trace material layer 302 for use in defining the desired trace patterns, and an overlying conductive material layer 303, to be patterned to define conductive contacts or vias electrically connecting to the pattern of traces being formed within the trace material layer 302, for instance, at trace terminal points. In one or more implementations, the trace material layer 302 can include nickel phosphorous (NiP), and the overlying conductive layer 303 can include copper. Note that these materials are identified by way of example only, and that other trace and/or conductive materials may be used within the build-up 300.

A first photoresist 304 is provided over build-up 300, and patterned with one or more openings 305, through which the overlying conductive layer 303 can be etched. Depending on the materials employed, and the etch processes used, a second etch process can be desired to remove portions of trace material layer 302 to define the conductive traces of the subject tamper-detection layer. First photoresist 304 can then be removed, and a second photoresist 304' is provided over the conductive layer 303 features to remain, such as the input and output contacts. Exposed portions of conductive layer 303 are then etched, and the second photoresist 304' can be removed, with any opening in the layer being filled, for instance, with an adhesive (or pre-preg) 306 and a next build-up layer is provided, as shown. Note that in this implementation, most of overlying conductive layer 303 is etched away, with only the conductive contacts or vias remaining where desired, for instance, at the terminal points of the traces formed within the layer by the patterning of the trace material layer 302. Note that any of a variety of materials can be employed to form the conductive lines or traces within a tamper-detection layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which can be employed include OhmegaPly®, offered by Ohmega Technologies, Inc., of Culver City, California (USA), or Ticer™, offered by Ticer Technologies of Chandler, Arizona (USA).

The trace lines or circuits within the tamper-detection layers, and in particular, the tamper-detection circuit zones, of the embedded tamper-detect circuit, or security circuit, along with the tamper-respondent sensor monitoring the enclosure, can be electrically connected to monitor circuitry provided, for instance, within secure volume 101 (FIG. 1A) of the tamper-respondent assembly. The monitor circuitry can include various bridges or compare circuits, and conventional printed wiring board electrical interconnect inside secure volume 101 (FIG. 1A), for instance, located within the secure volume defined by the tamper-detection frames 201 (FIG. 2), and the tamper-detection mat layers 200 (FIG. 2).

Note that advantageously, different tamper-detection circuit zones on different tamper-detection layers can be electrically interconnected into, for instance, a common tamper-detect circuitry. Thus, any of a large number of interconnect configurations are possible. Note also, that the power supply or battery for the tamper-respondent sensor(s) can be located internal or external to the secure volume, with the sensor being configured in one or more embodiments to trip and destroy any protected or critical data if the power supply or battery is tampered with.

Figure 4:
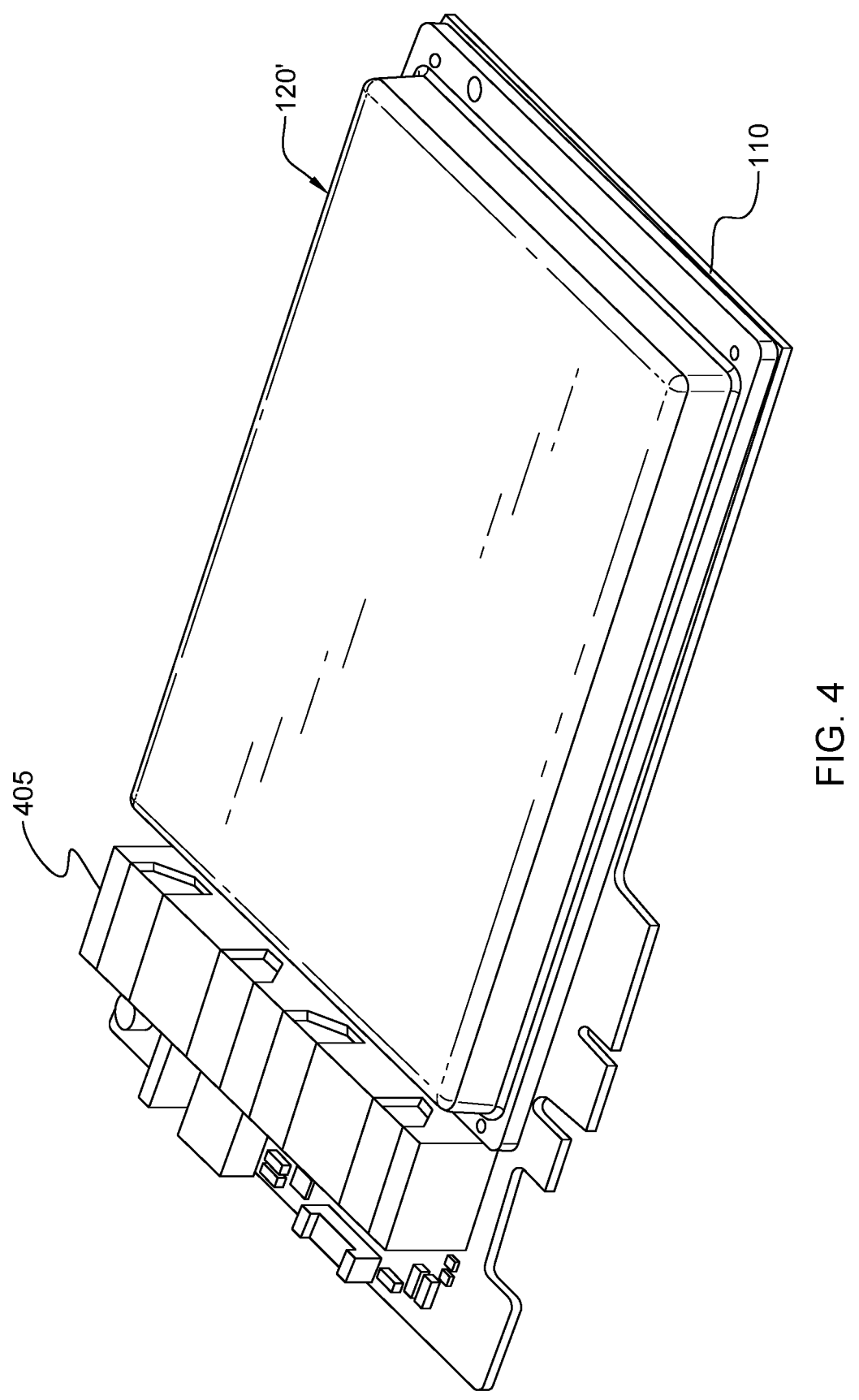
FIG. 4 is an isometric view of one embodiment of a tamper-respondent assembly, in accordance with one or more aspects of the present disclosure.

By way of further example, an isometric view of one embodiment of a tamper-respondent assembly is depicted in FIG. 4, where an enclosure 120' (similar to enclosure 120 of FIG. 1A) is shown sealed to multilayer circuit board 110 to define a secure volume about one or more electronic components. In the embodiment depicted, enclosure 120' is formed of a thermally conductive material, and facilitates defining a secure volume, such as described herein. A power supply 405 or battery for the tamper-respondent sensor can be located, as depicted in this embodiment, external to the secure volume, with the tamper detector being configured to destroy any protected or critical data if the power supply or battery is tampered with. Enclosure 120' can be adhered to multilayer circuit board 110, which as noted herein, can include its own tamper protection in a variety of configurations.

When considering tamper-proof packaging, the electronic package needs to achieve defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-3 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs).

As intrusion technology continues to evolve, anti-intrusion technology needs to continue to improve to stay ahead. To address the demands for ever-improving anti-intrusion technology, and the higher performance encryption/decryption functions being provided, enhancements to a security Level 4 tamper-proof, tamper-evident packaging for one or more electronic components or assemblies are desired.

Disclosed herein with reference to FIGS. 5-13 are various chemical-sensing-based tamper-respondent or tamper-proof assemblies and methods of fabrication which provide, for instance, a security Level 4 secure volume for accommodating one or more electronic components, such as one or more encryption and/or decryption modules and associated components of, for instance, a communications card or other electronic assembly to be protected, and which provide enhanced manufacturability, and lower expense, while meeting the highest level of FIPS security requirements.

Aspects of the present disclosure utilize, in part, a chemical sensing methodology for tamper protection of the tamper-respondent assembly, such as a hardware security module (HSM). The assemblies and methodologies described can be used, for instance, in place voltage monitoring of a flexible tamper-respondent assembly adhered to the inner surface of the enclosure, such as described above. In particular, in accordance with one or more aspects disclosed herein, a fluid having a chemical mixture of multiple chemical substances is provided in one or more embodiments within the sealed space or secure volume of the tamper-respondent assembly, with the fluid being monitored in operation for a chemical substance concentration change indicative of a tamper event affecting the secure volume.

Note that, as used herein, the "fluid" utilized within the sealed space or secure volume can be a gas, a liquid, a gas-liquid combination, a quasi-solid, or other flowable media, that includes a chemical mixture of multiple chemical substances, with the multiple chemical substances having randomly generated concentrations within the chemical mixture. In one example only, the fluid can include multiple inert gases having randomly generated concentrations within the chemical mixture. Should an attempt be made to enter the secure volume, then a change in concentration of one or more of the chemical substances within the chemical mixture or a change in the respective partial pressure is detected. For instance, sensor signals from one or more chemical sensors, and one or more pressure sensors (as well as one or more temperature sensors) can be obtained and compared to initial concentration values of the chemical mixture stored within the secure volume to ascertain whether to trigger a tamper protection response from the monitor circuit, such as described herein.

With a manufacturing methodology such as disclosed herein, the chemical substance concentrations within the chemical mixture of the fluid are unique for each tamper-respondent assembly being manufactured, and the tamper monitor and sensor circuits adjust during tamper-proof initialization such that an individual tamper-respondent assembly is produced which cannot be circumvented by attempting to match a fluid outside the tamper-respondent assembly with the unique, randomized fluid media stored within the secure volume of the tamper-respondent assembly. Disclosed herein, in one or more aspects, is the use of chemical sensing to provide tamper protection, where the fluid, and in particular, the chemical mixture of the fluid, has unique, randomly generated chemical substance concentrations and/or partial pressures within the secure volume. Within this environment, sensor monitoring of the fluid is used to monitor for a tamper event into the tamper-respondent assembly.

In one or more implementations, the fluid provided within the secure volume can contain a specific chemical marker consisting (for instance) of an inert medium, made up of two or more chemical substances. Two or more individual substances, or chemical substances, and their respective concentrations in the fluid are set in proprietary or unique ratios for each individual tamper-respondent assembly. The individual substances and the ratios can be set differently for each tamper-respondent assembly, and known only to a controller or monitor component within each individual tamper-respondent assembly. In one or more embodiments, sensors, such as chemical sensors, are provided within the secure volume to continually measure the concentration of one or more of the chemical substances of the chemical mixture of the fluid within the tamper-respondent assembly. Any abnormal change in the concentration of one or more chemical substances and/or a pressure within the secure volume is construed as an attempt to gain access to the enclosure, and the monitor component or circuit of the tamper-respondent assembly can initiate action based on detecting the tamper event. Note in this regard that, the total pressure within the secure volume can also be monitored, as well as partial pressures of the different chemical substances of the mixture within the secure volume. In one implementation, each partial pressure species (e.g., chemical substance) can have an associated pressure sensor within the secure volume and, in one or more embodiments, a total pressure sensor can be provided within the secure volume as well. An abnormal change in the total pressure sensed, or an abnormal change in one or more of the partial pressures, can also trigger detection of a tamper event, in one or more embodiments.

Figure 5:
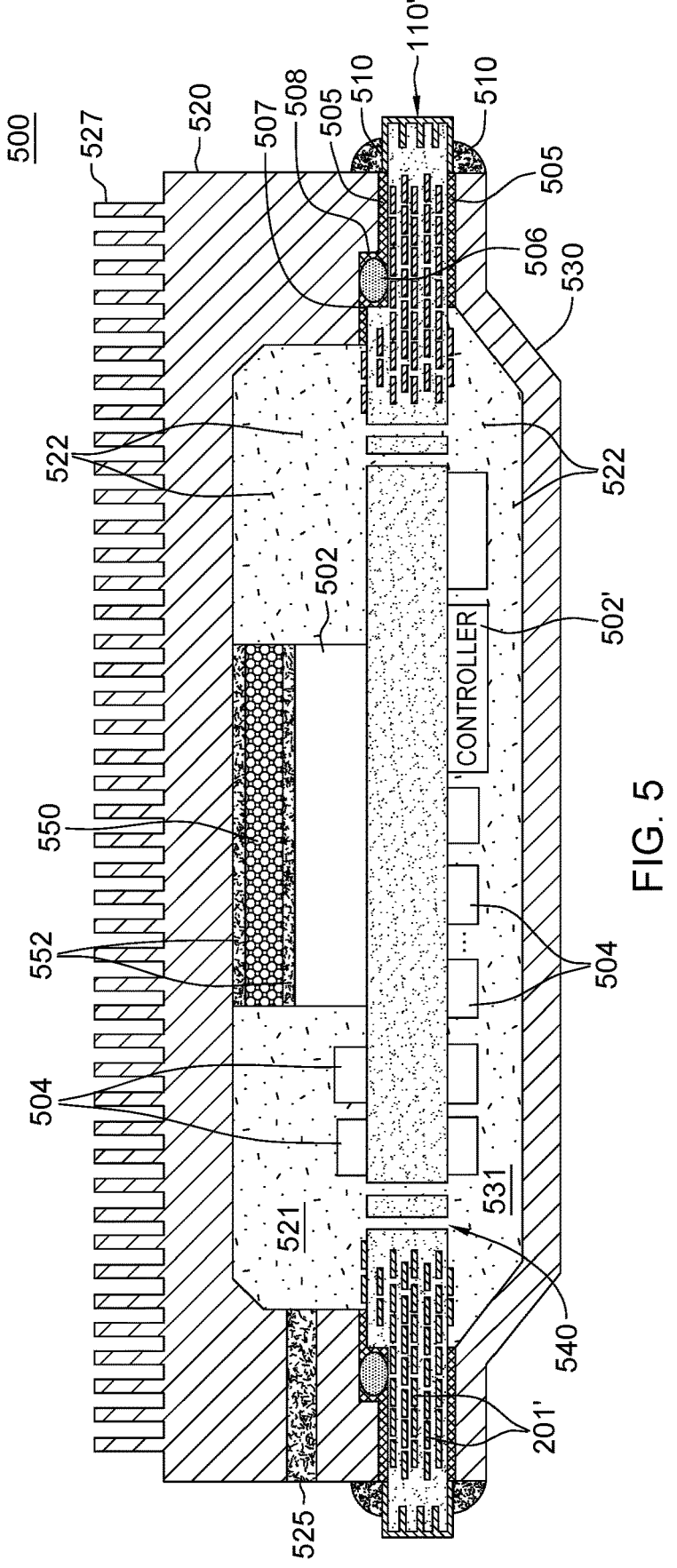
FIG. 5 is a cross-sectional elevational view of one embodiment of a tamper-respondent assembly incorporating a fluid with an individualized chemical mixture, in accordance with one or more aspects of the present disclosure.

FIG. 5 depicts one embodiment of a tamper-proof electronic package or tamper-respondent assembly 500, in accordance with one or more aspects of the present disclosure. Tamper-respondent assembly 500 includes a multilayer circuit board 110', such as multilayer circuit board 110 described above in connection with FIGS. 1A-3. In this embodiment, a secure volume 521 is formed about one or more electronic components 502 on one side of multilayer circuit board 110' by securing an enclosure 520, such as a five-sided or pedestal-type enclosure, to multilayer circuit board 110' using an adhesive 505, and another secure volume 531 is formed about one or more electronic components, including a controller 502', on another side of the multilayer circuit board 110', by securing another enclosure 530, such as another five-sided or pedestal-type enclosure, to multilayer circuit board 110' using adhesive 505. Note that different attachment approaches can be used in securing enclosures 520, 530 to multilayer circuit board 110'. In the example of FIG. 5, in addition to adhesive 505, multilayer circuit board 110' can be configured with a ledge 507, and enclosure 520 can be configured with a ledge 508, with the ledges being positioned in opposing relation, and a gasket or seal 506 being provided between the opposing ledges 507, 508 of the circuit board and enclosure, as illustrated. Additionally, an adhesive 510 can be provided about the perimeter of enclosures 520, 530 when secured to multilayer circuit board 110'. In another embodiment, enclosure 530 is shown directly secured to the other side of multilayer circuit board 110' using adhesives 505, 510. Other approaches to attaching the enclosures to the multilayer circuit board are possible.

Note also that a variety of different enclosure designs can be used within tamper-respondent assembly 500, with, for instance, enclosure 520 including (by way of example) a plurality of thermally conductive fins 527, such as a plurality of thermally conductive pin fins, to facilitate air-cooling of enclosure 520. In one or more embodiments, enclosures 520, 530 are formed of a metal or metal composite material to facilitate transfer of heat from the respective secure volumes 521, 531 outward from the tamper-respondent assembly.

As illustrated, in one or more embodiments, a porous metal block 550 and thermal interface material 552 can be provided over one or more electronic components 502 to facilitate conduction of heat from one or more electronic components 502 outward, such as to enclosure 520 and thermally conductive fins 527 in FIG. 5, while still allowing a fluid such as discussed herein to reside over the electronic component for tamper-detect protection. By way of example, porous metal block 550 can be, for instance, a 3-D printed porous copper block.

In the embodiment of FIG. 5, perimeter security traces, such as one or more tamper-detection frames 201', are provided within multilayer circuit board 110' at the aligned peripheries of the enclosures 520, 530. In one or more embodiments, tamper-detection frames 201' are similar to tamper-detection frames 201 described above in connection with FIGS. 1A-3. These perimeter security traces facilitate securing the assembly against any attempted tamper event into, or through, the multilayer circuit board, such as into the secure volume 521, 531.

In the embodiment of FIG. 5, secure volumes 521, 531 are shown in fluid communication via a plurality of through-holes 540, such as a plurality of plated through-holes, which extend through multilayer circuit board 110'. In this manner, secure volumes 521, 531 form one continuous secure volume above and below the region of multilayer circuit board 110' between enclosures 520, 530.

In one or more embodiments, each secure volume 521, 531 is a sealed space, and the secure volumes 521, 531 are filled with a fluid 522 via, for instance, a fill port 525 located in enclosure 520, in one example. Fluid 522 contains a unique chemical mixture of multiple chemical substances, such as multiple inert gases, liquids, etc. In one or more embodiments, the chemical mixture of the fluid provided into the secure volumes is unique to each tamper-respondent assembly. A mix and fill procedure to obtain the fluid mixture is described further below with reference to FIGS. 10A-11.

After secure volumes 521, 531 are filled with fluid 522, fill port 525 is sealed, such as, for instance, via an epoxy, solder, etc. Note that in one or more other embodiments, secure volumes 521, 531 can be different sealed spaces provided with different fluids having different chemical mixtures, such as in an embodiment without through-holes 540. In that case, an additional fill port can be provided through enclosure 530 to fill secure volume 531 with an individualized fluid.

As illustrated in FIG. 5, in one embodiment, multiple sensors 540 are provided within the secure volumes 521, 531 including, for instance, one or more chemical sensors, one or more pressure sensors, and one or more temperature sensors. The sensor signals are used herein to detect changes to the chemical mixture concentrations and/or pressures of the fluid within the secure volumes 521, 531. In one or more embodiments, the monitor component can be a circuit, or program code implemented within a component 502 or a controller 502', which is configured to detect a tamper event such as disclosed herein. In one or more embodiments, the monitor component can include, at least in part, a hardware circuit implemented within one or both of the secure volumes 521, 531. In one or more other embodiments, the monitor component can be configured as a combination of hardware and software, or in another embodiment, principally a software-implemented monitor component, such as monitor logic implemented within a controller 502' as, for instance, a monitor and control module.

Figure 6:
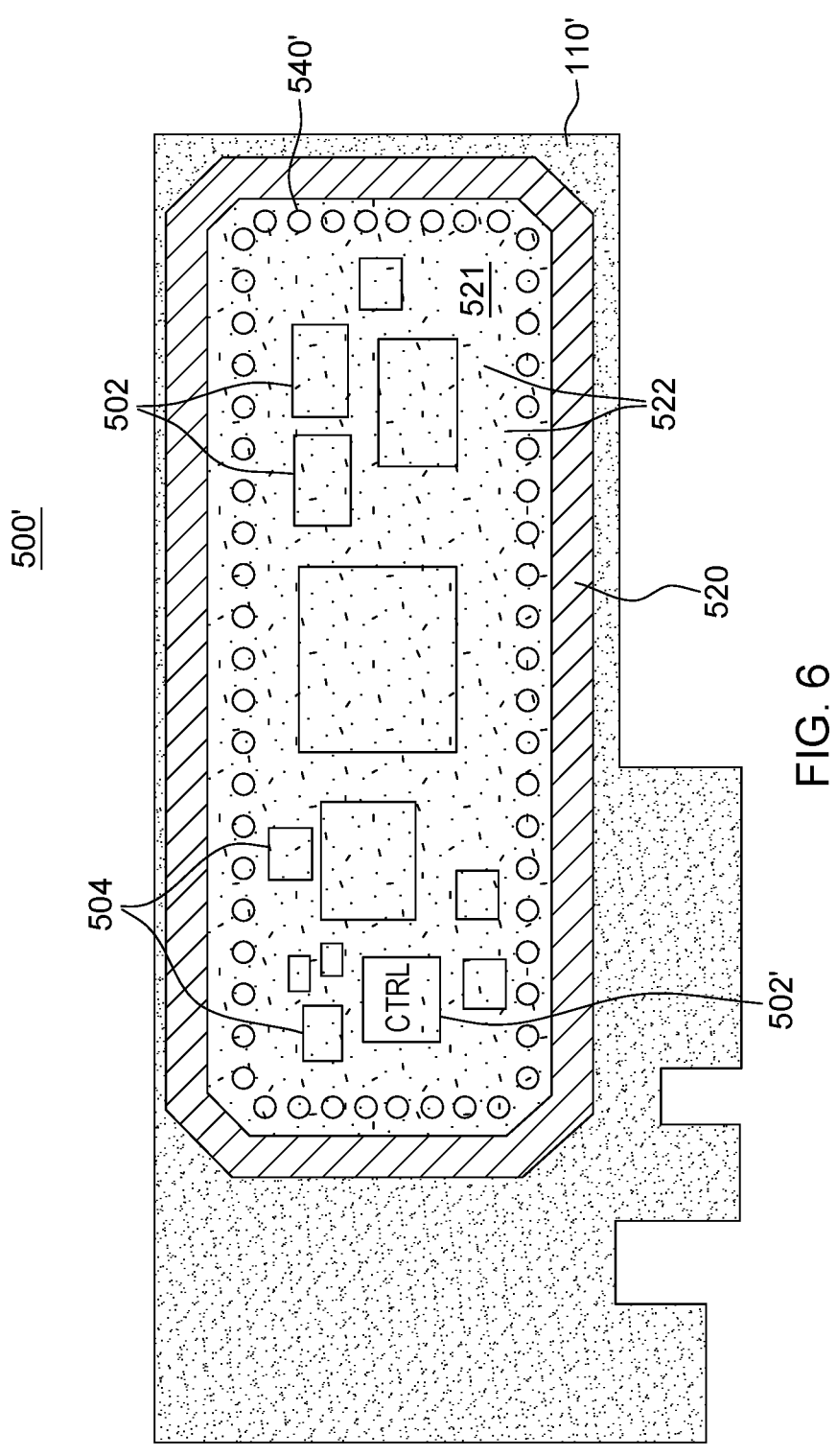
FIG. 6 is a partial cross-sectional plan view of another embodiment of a tamper-respondent assembly incorporating a fluid with an individualized chemical mixture, in accordance with one or more aspects of the present disclosure.

By way of example, FIG. 6 is a partial cross-sectional plan view of another embodiment of a tamper-respondent assembly 500', which is similar to tamper-respondent assembly 500 described above in connection with FIG. 5, and includes, for instance, a fluid 522 having an individualized chemical mixture, in accordance with one or more aspects of the present disclosure. Tamper-respondent assembly 500' illustrates another implementation of through-holes 540' for a fluid exchange between one secure volume 521 on one side of multilayer circuit board 110' and another secure volume on another side of multilayer circuit board 110', such as illustrated in FIG. 5. In the embodiment illustrated, through-holes 540', which can be plated through-holes, are located peripherally about the secure volume. This represents another example only of the number and placement of through-holes in a multi-secure volume implementation of a tamper-respondent assembly. One or more electronic components 502, including a controller 502', are shown disposed on the one side of multilayer circuit board 110' within secure volume 521 protected by fluid 522 and the chemical sensing methodology for tamper protection disclosed herein.

In the embodiment of FIG. 6, multiple sensors 504, such as one or more chemical sensors, pressure sensors and temperature sensors are provided within secure volume 521 defined, at least in part, by enclosure 520. In one or more implementations, two or more chemical sensors and two or more pressure sensors can be located within the secure volume dispersed, for instance, about the periphery of the secure volume to enhance sensitivity to a potential tamper event, that is, to enhance detectability of a potential tamper event by a change in a chemical concentration of the chemical mixture of the fluid within the secure volume.

Figure 7:
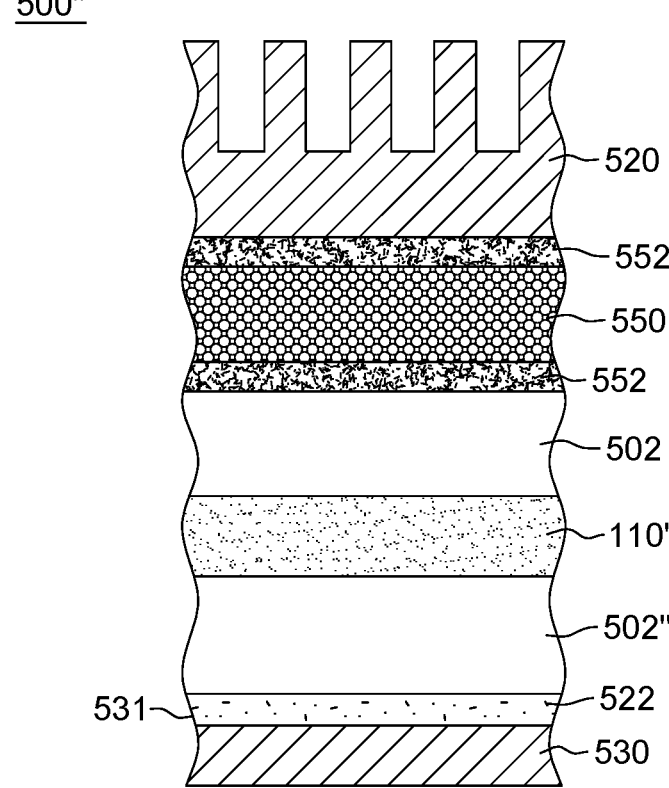
FIG. 7 is a partial schematic depiction of another embodiment of a tamper-respondent assembly incorporating a fluid with an individualized chemical mixture, in accordance with one or more aspects of the present disclosure.

FIG. 7 illustrates another embodiment of a tamper-respondent assembly 500", similar to tamper-respondent assemblies 500, 500' of FIGS. 5-6, described above. In particular, tamper-respondent sensor 500" implements a chemical sensing methodology for tamper protection of the tamper-respondent assembly similar to that described above in connection with FIGS. 5 & 6, with a fluid 522 being provided containing a specific chemical marker consisting of two or more chemical substances within respective secure volumes, where the chemical substances have randomly generated concentrations within the chemical mixture, such as described herein. Within this context, tamper-respondent assembly 500" of FIG. 7 is illustrated to show provision of a more condensed stack-up of tamper-respondent assembly components compared with a tamper-respondent assembly implementation such as initially described with reference to FIGS. 1A-2. In particular, in the stack-up of FIG. 7, the separate tamper-respondent sensors of FIGS. 1A-2 adhesively secured to the inner surfaces of the enclosures are omitted from tamper-respondent assembly 500" due to the presence of the surrounding fluid about the electronic components 502, 502" on opposite sides of multilayer circuit board 110'. The tamper-respondent methodology disclosed herein provides tamper protection using chemical and/or pressure sensing in place of electrical tamper sensing, as in the case with the embodiments of FIGS. 1A-2, and enables removal of the separate tamper-respondent sensors and associated adhesives and assembly procedures, simplifying assembly and enabling cost savings and thermal benefits as well.

By way of example, one or more electronic components 502 are coupled to enclosure 520 via porous metal block 550 and associated thermal interface material 552. Advantageously, porous metal block 550 facilitates thermal conduction of heat outward from electronic component 502 to enclosure 520 for dissipation to the surrounding environment (in the case of an air-cooled enclosure), and allows for fluid within the secure volume to reside within the porous metal block 550 to provide tamper-proof protection over electronic component 502, as well as the other regions of the secure volume formed between enclosure 520 and multilayer circuit board 110'. In the example of FIG. 7, electronic component 502" resides within secure volume 531 defined between enclosure 530 and multilayer circuit board 110', with secure volume 531 containing fluid 522 such as described. Note that removing the inner-surface-attached tamper-respondent sensors of the FIGS. 1A-2 embodiment advantageously reduces the overall thermal impedance of the material stack, and using a porous metal block where a thick thermal interface material would otherwise be needed also results in lower thermal interface bond lines for higher heat-generating electronic components, such as larger, higher power components within the secure volume.

Figure 8:
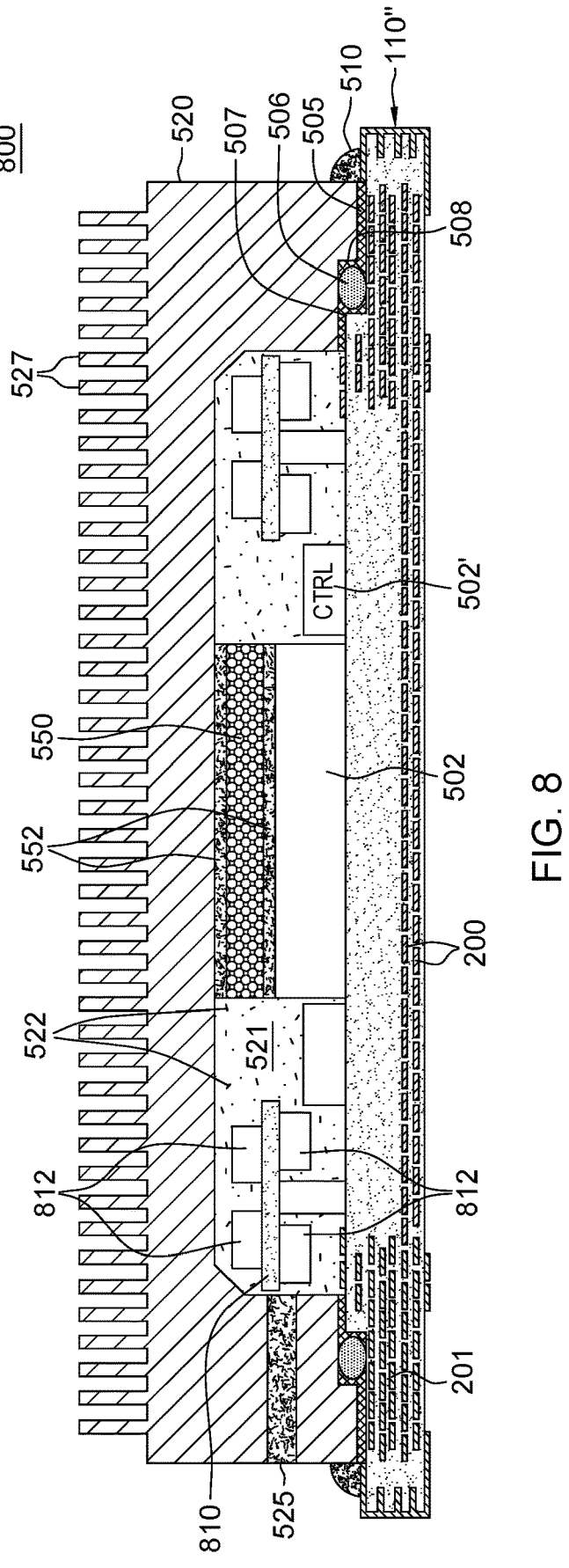
FIG. 8 is a cross-sectional elevational view of another embodiment of a tamper-respondent assembly incorporating a fluid having an individualized chemical mixture, in accordance with one or more aspects of the present disclosure.

FIG. 8 illustrates another embodiment of a tamper-proof electronic package or tamper-respondent assembly 800, in accordance with one or more aspects of the present disclosure. Tamper-respondent assembly 800 includes a multilayer circuit board 110", such as multilayer circuit board 110 described above in connection with FIGS. 1A-3. In this embodiment, secure volume 521 is formed about one or more electronic components 502, 502' on one side of multilayer circuit board 110", between the circuit board and an enclosure 520, such as a five-sided or pedestal-type enclosure described above. In one embodiment, enclosure 520 is secured to multilayer circuit board 110" via a structural adhesive 505, and includes a gasket 506 residing between opposing ledges 507 and 508 in multilayer circuit board 110" and enclosure 520, respectively. In addition, a peripheral adhesive 510 is provided along the periphery of enclosure 520 at the interface of the enclosure with multilayer circuit board 110".

A variety of different enclosure designs can be used within tamper-respondent assembly 800, with enclosure 520 including, by way of example, a plurality of thermally conductive fins 527, such a plurality of thermally conductive pin fins to facilitate air-cooling of the enclosure 520. In one embodiment, enclosure 520 is formed of a metal or metal composite material to facilitate transfer of heat from secure volume 521 outward from the tamper-respondent assembly.

As illustrated, in one or more embodiments, a porous metal block 550 and thermal interface material 552 are provided over one or more high-heat-dissipating electronic components 502 to facilitate conduction of heat from the electronic components outward through enclosure 520, while still allowing a fluid such as disclosed herein to reside over the electronic component for tamper-detect protection. By way of specific example, porous metal block 550 can be, for instance, a 3-D printed porous copper block.

In the embodiment of FIG. 8, perimeter security traces, such as one or more tamper-detection frames 201 and one or more tamper-detection mat (or base) layers 200 can be provided. As noted above with respect to FIG. 2, the lower-most tamper-detection mat layer 200 can be a continuous sensor-detect layer extending completely below the secure volume being defined within and/or above multilayer circuit board 110". Together, tamper-detection frames 201 and tamper-detection mat layers 200 within multilayer circuit board 110" facilitate defining secure volume 521 by protecting against a tamper event into, or through, the multilayer circuit board, such as into the secure volume between enclosure 520 and multilayer circuit board 110".

In an embodiment, secure volume 521 is a sealed space that is filled with a fluid 522 via a fill port 525 in enclosure 520. Fluid 522 contains a unique chemical mixture of multiple chemical substances, such as multiple inert gases, liquids, etc., such as disclosed herein. In one or more embodiments, the chemical mixture of the fluid provided into the secure volume 521 is unique to each tamper-respondent assembly. As noted, one embodiment of a mix-and-fill procedure to obtain the fluid mixture is described below with reference to FIGS. 10A-11. After secure volume 521 is filled with fluid 522, fill port 525 is sealed, such as, for instance, via an epoxy, solder, etc.

In the embodiment of FIG. 8, tamper-respondent assembly 800 further includes a sensor card 810 or sensor sub-assembly having a plurality of sensors 812 disposed on one or both sides of sensor card 810. In one embodiment, sensor card 810 is mechanically and electrically connected as a pedestal-type sensor card on or above multilayer circuit board 110" within secure volume 521 of the assembly. Such an embodiment provides additional space for locating the plurality of sensors 812 within secure volume 521, with the sensors including, for instance, one or more chemical sensors, one or more pressure sensors, and/or one or more temperature sensors, for providing sensor signals to a monitor component or circuit within the secure volume. The monitor component can be implemented, for instance, on one or more of electronic components 502, or a control component 502' within secure volume 521. Sensor signals from sensors 812 within secure volume 521 are monitored at the monitor component or circuit for changes to the chemical mixture concentrations and/or pressures within the secure volume by comparing the sensor signals or data to, for instance, an initially measured and saved chemical concentration profile, to detect occurrence of a tamper event into the secure volume based on a fluid change.

Figure 9:
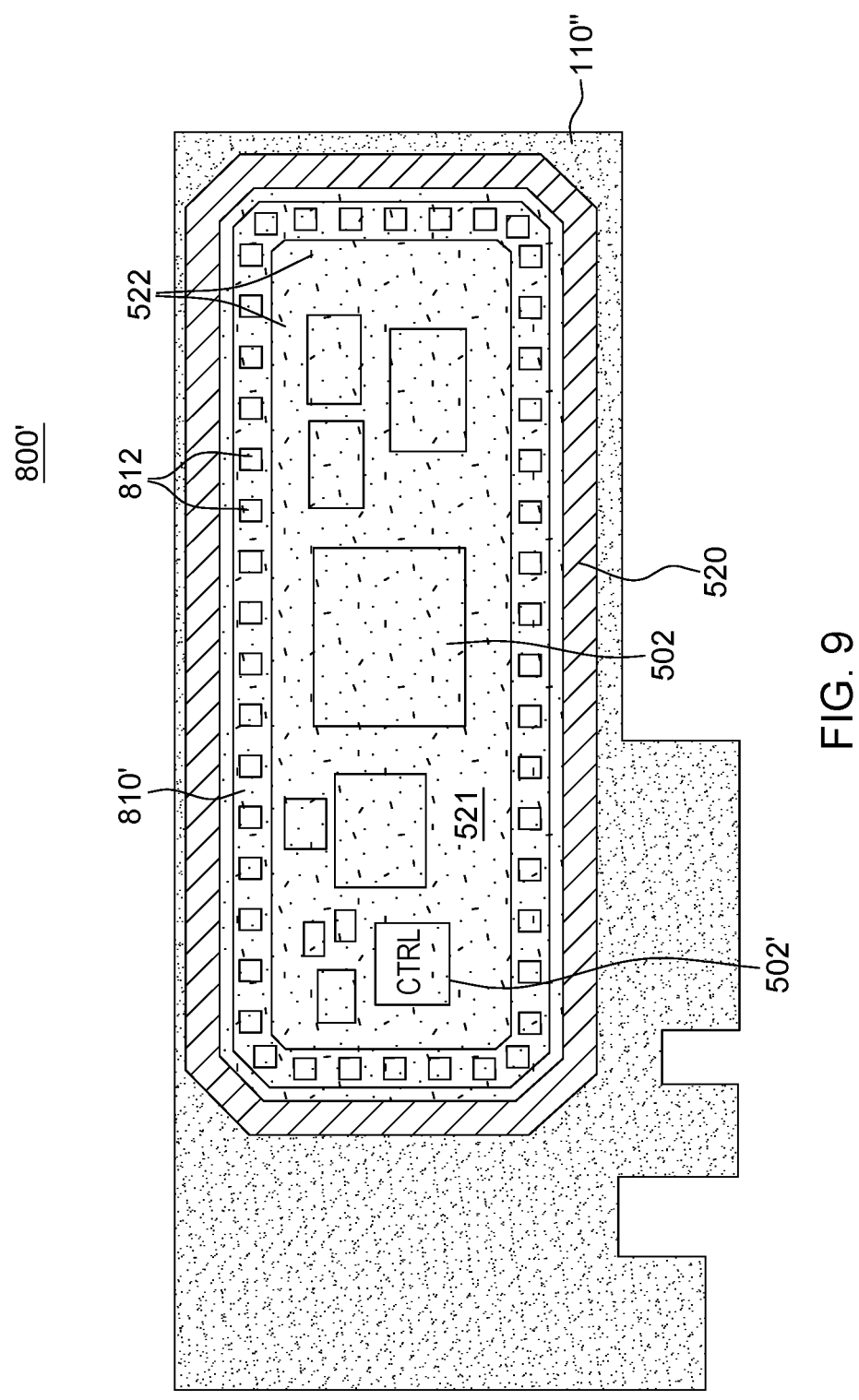
FIG. 9 depicts a cross-sectional plan view of a further embodiment of tamper-respondent assembly incorporating a fluid with an individualized chemical mixture, in accordance with one or more aspects of the present disclosure.

Many variations to sensor card 810 of the tamper-respondent assembly of FIG. 8 are possible. FIG. 9 illustrates another embodiment of a tamper-respondent assembly 800', similar to tamper-respondent assembly 800 of FIG. 8. As illustrated, tamper-respondent assembly 800' includes multilayer circuit board 110" with enclosure 520 mounted to one side of the circuit board to define a secure volume 521 about one or more electronic components 502, 502', with the secure volume 521 being filled with a fluid 522, such as described herein. In the embodiment of FIG. 9, a sensor card 810', or sensor sub-assembly, is shown, where the sensor sub-assembly includes a plurality of sensors 812 disposed on one or both main surfaces of the sensor card. In the embodiment illustrated, sensor card 810' extends about the periphery of the secure volume 521 near an inner surface of enclosure 520 to locate the plurality of sensors 812 close to the different sides of enclosure 520 to more quickly detect occurrence of any tamper event into secure volume 521 through a wall of enclosure 520. In this manner, 360° of physical security is provided by the fluid disposed within secure volume 521 and the sensors 812 arranged around the periphery of secure volume 521. As noted, in one or more implementations, fluid 522 within the secure volume has a unique chemical mixture of gases, liquids, etc., with the chemical mixture being unique to each tamper-respondent assembly fabricated. As described, any abnormal changes in chemical mixture concentrations and/or pressure concentrations within the secure volume are detected by the monitor component and cause a tamper-detect event trigger to occur.

Figure 10A:
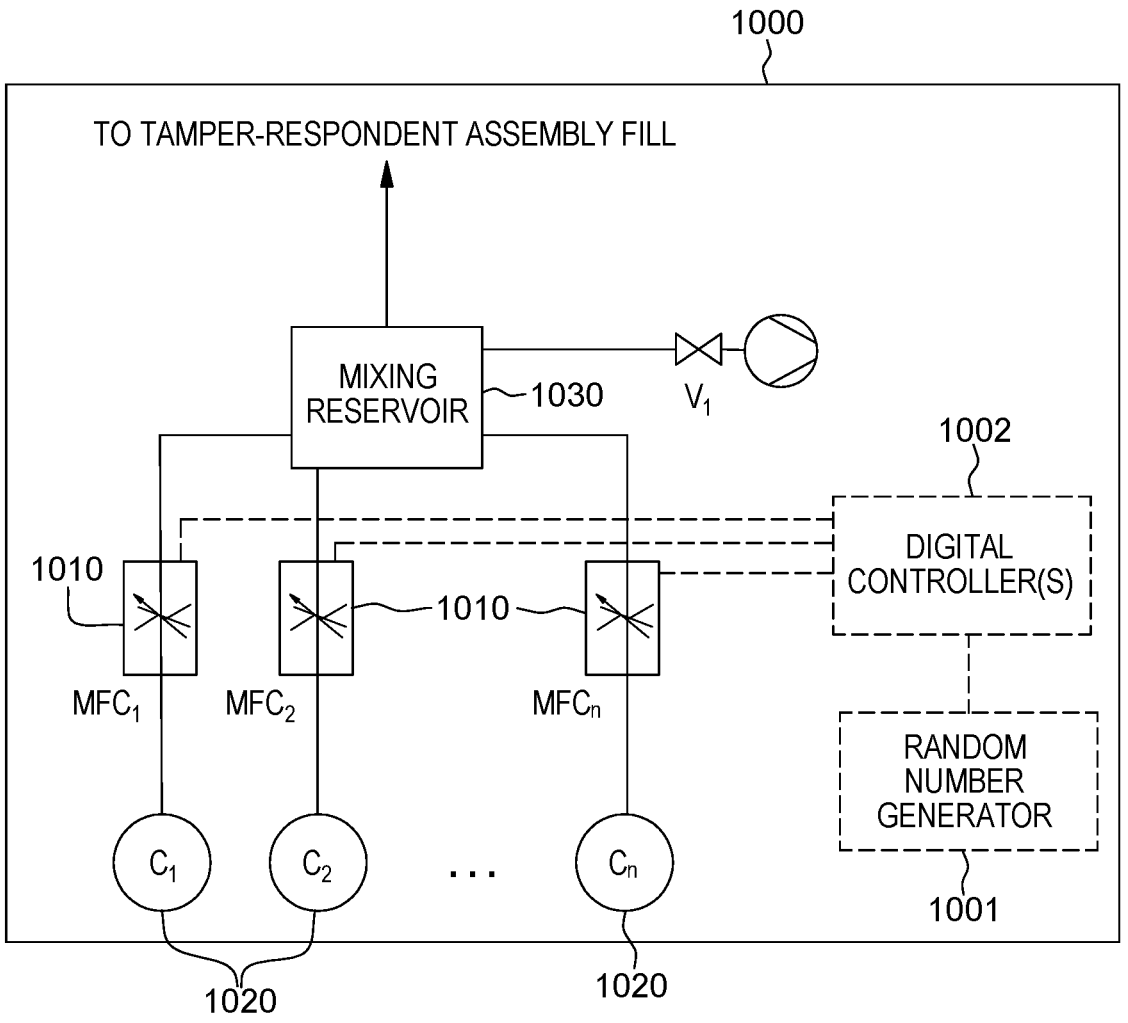
FIG. 10A depicts one embodiment of a fill system for mixing and providing a fluid with a chemical mixture of multiple chemical substances with randomly generated concentrations, in accordance with one or more aspects of the present disclosure.

FIG. 10A illustrates one embodiment of a fill system 1000 for mixing and providing to a tamper-respondent assembly a fluid containing a chemical mixture of multiple chemical substances with randomly generated concentrations, such as described herein. As illustrated, in one embodiment, fill system 1000 includes multiple mass flow controllers ($MFC_1$, $MFC_2 \ldots MFC_n$) 1010, which are controlled by one or more digital controllers 1002, and where the flow rates are set by respective random numbers provided by a random number generator 1001. In one embodiment, the range of random numbers generated matches the flow range and encoding precision for the mass flow controllers, as well as keeps the total pressure and chemical concentrations within a window defined by the physical limits of the tamper-respondent assembly enclosure and the sensors utilized within the secure volume. In one or more embodiments, the mass controller flow accuracy is not critical, as the final concentration values are measured in-situ within the tamper-respondent assembly and stored locally within the secure volume once provided. In one or more embodiments, the fill system and any computer hardware and/or software utilized in the fill process and initialization of the tamper-respondent assembly is configured to ensure that the random numbers, and resulting flow rates of the different chemical substances, provided from the respective chemical substance sources ($C_1, C_2 \ldots C_n$) 1020 are not stored or recorded to prevent reverse engineering of the fill concentrations. As illustrated, the mass flow controllers provide the different concentrations of chemical substances into a mixing reservoir 1030, which then provides the fluid to the tamper-respondent assembly during the fill process. A valve $V_1$ couples mixing reservoir 1030, in one or more embodiments, to a vacuum pump to facilitate evacuating the mixing reservoir 1030 between each fill of a tamper-respondent assembly so that the prior assembly's mixture is fully removed before filling the next assembly. In operation, the random number generator provides a random number which sets for each mass flow controller the amount of chemical substance flow through the mass flow controller, with the amount of time that the mass flow controllers are ON being, in one embodiment, a set time interval. Together, the concentration flows into the mixing reservoir and the set timer interval determine the resultant pressure of the fluid within the mixing reservoir.

FIG. 10B depicts one embodiment of a process for producing a fluid with a unique chemical mixture for use in filling a secure volume of a tamper-respondent assembly, in accordance with one or more aspects of the present disclosure. As illustrated, in one embodiment, the production process includes connecting the tamper-respondent assembly to a fill system 1050, such as the fill system of FIG. 10A. A 'fill' signal is sent to the fill system 1052, and the mixing reservoir in the fill system is evacuated 1054. The random number generator generates a random number for each mass flow controller (MFC) 1056, and the chemical flow rate through each mass flow controller is set by the respective random number 1058. The chemical substances are provided into the mixing reservoir for a set time 1060. Once the fluid is produced, the fluid is provided from the mixing reservoir into the secure volume of the tamper-respondent assembly 1062. Within the secure volume of the tamper-respondent assembly, concentrations of the different chemical substances are measured by the tamper-respondent assembly sensors disposed within the secure volume 1064. The initial chemical concentrations are stored within the secure volume, for instance, within non-volatile memory of the tamper-respondent assembly 1066, and can then be used in subsequent comparison by the monitor component to determine whether an abnormal change in one or more concentration levels has occurred.

As noted herein, the sensors within the secure volume for sensing the chemical concentration can include one or more chemical sensors and one or more pressure sensors, as well as one or more temperature sensors. The pressure sensors can be used in combination with the chemical sensors where, for instance, it is difficult to locate a specific chemical sensor for sensing a particular chemical substance concentration within the fluid in the secure volume. For instance, in the case where there are four chemical substances within the chemical mixture, and chemical sensors are provided for three of the four chemical substances, the fourth chemical substance concentration can be determined from the measured concentrations of the three chemical substances plus the total pressure within the secure volume. This provides flexibility in choosing chemical substances (for instance, gases) that can be used within the fluid, even if there is not readily available a discrete chemical sensor for that gas. By way of example only, chemical substances that can be used to produce the chemical mixture can include Ar, $N_2$, $O_2$, $CO_2$, $SF_6$, etc.

FIG. 11 depicts one embodiment of a process for filling and initializing tamper protection for a tamper-respondent assembly with a fluid having an individualized chemical mixture, such as described herein. In the embodiment illustrated, the tamper-respondent assembly is plugged into a manufacture (MFG) test system 1100, and a command to initialize the tamper-respondent assembly circuitry into a programmable manufacture mode is issued 1102. The tamper-respondent assembly is then unplugged from the MFG test system 1104, and the secure volume is filled with a uniquely produced chemical mixture (as described in the mixing and filling procedure above) 1106. In the embodiment illustrated, the tamper-respondent assembly is inserted into a manufacture test thermal chamber and test machine workstation 1108. A thermal chamber profile is then run from, for instance, sub-zero to a specified high temperature environment, and chemical, pressure and temperature sensor data is recorded 1110. A command is issued to store the chemical mixture profile versus pressure and temperature variations 1112 within the secure volume, for instance, in non-volatile memory of the secure volume of the tamper-respondent assembly. This ensures that the sensor data can be compared to the stored profile data during operation of the tamper-respondent assembly. A command is issued to initiate the tamper-detect operation on the tamper-respondent assembly 1114, and the assembly is unplugged from the manufacture test system 1116.

Figure 12:
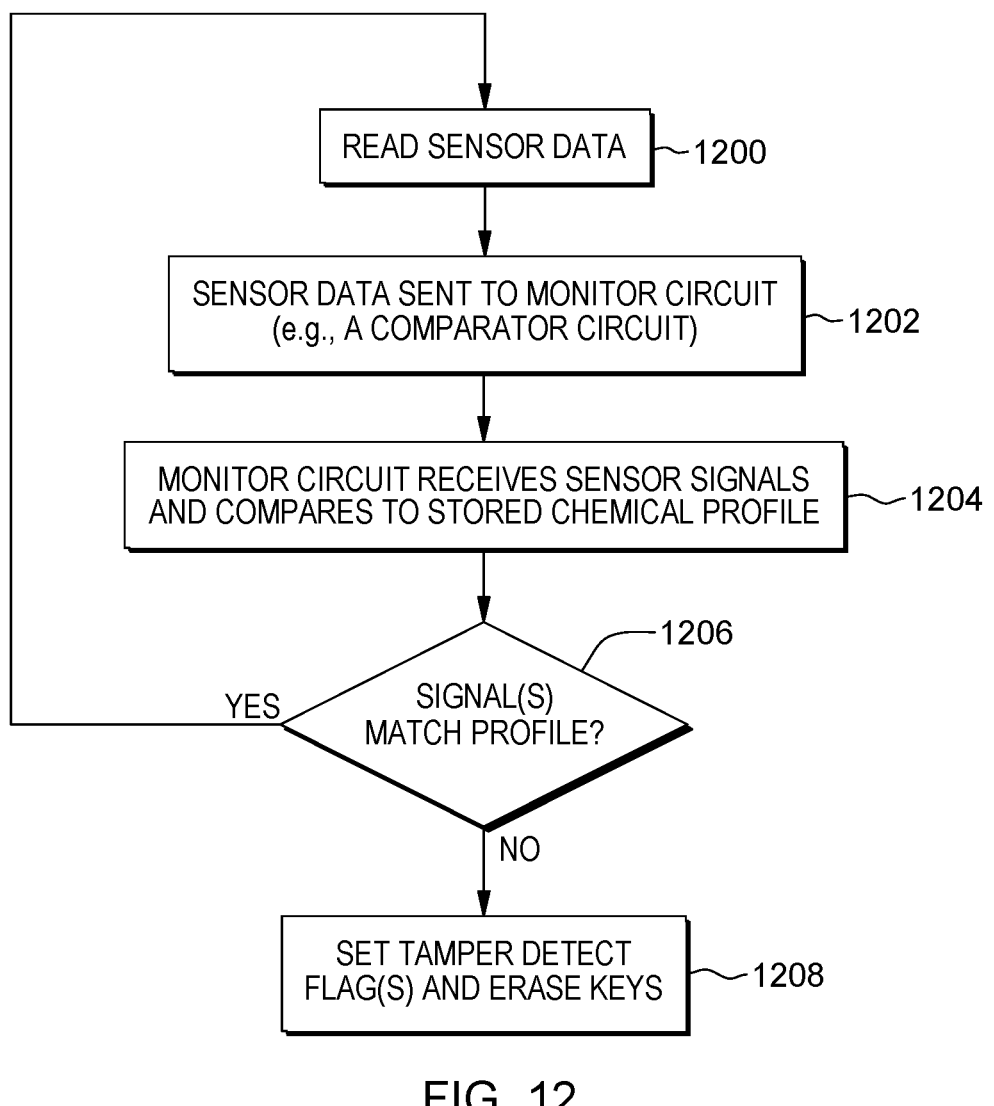
FIG. 12 depicts one embodiment of a process for monitoring within a tamper-respondent assembly for a change in the chemical mixture of the fluid indicative of a tamper event, in accordance with one or more aspects of the present disclosure.

FIG. 12 depicts one embodiment of a process for monitoring within a tamper-respondent assembly for a change in the chemical mixture of the fluid indicative of a tamper event. As illustrated, in one embodiment, the sensor data or sensor signals are read 1200, and the sensor data is sent to the monitor component or circuit 1202, which in one embodiment, can include a comparator circuit. The monitor component receives the sensor signal data and compares the signals to the stored chemical profile 1204. The monitor component determines whether the signals match the stored chemical mixture profile versus pressure and temperature 1206. If "yes", then the process loops back to read new sensor data 1200. In this manner, the monitor component is continually monitoring the sensor data for a potential abnormality indicative of a tamper event. Should the signals not match the stored profile 1206, then one or more tamper-detect flags can be set to initiate, for instance, erasing of one or more stored encryption/decryption keys 1208, in one example.

One or more aspects of the present disclosure are incorporated in, performed and/or used by a computing environment. As examples, the computing environment can be of various architectures and of various types, including, but not limited to: personal computing, client-server, distributed, virtual, emulated, partitioned, non-partitioned, cloud-based, quantum, grid, time-sharing, clustered, peer-to-peer, mobile, having one node or multiple nodes, having one processor or multiple processors, and/or any other type of environment and/or configuration, etc., that is capable of executing a process (or multiple processes) that, e.g., perform self-tuning merged code test processing, such as disclosed herein. Aspects of the present disclosure are not limited to a particular architecture or environment.

Prior to further describing detailed embodiments of the present disclosure, an example of a computing environment to include and/or use one or more aspects of the present disclosure is discussed below with reference to FIG. 13.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1300 contains an example of an environment for the execution of at least some of the computer code involved in performing the inventive methods, such as tamper-detect monitor module block 1350. In addition to block 1350, computing environment 1300 includes, for example, computer 1301, wide area network (WAN) 1302, end user device (EUD) 1303, remote server 1304, public cloud 1305, and private cloud 1306. In this embodiment, computer 1301 includes processor set 1310 (including processing circuitry 1320 and cache 1321), communication fabric 1311, volatile memory 1312, persistent storage 1313 (including operating system 1322 and block 1350, as identified above), peripheral device set 1314 (including user interface (UI) device set 1323, storage 1324, and Internet of Things (IoT) sensor set 1325), and network module 1315. Remote server 1304 includes remote database 1330. Public cloud 1305 includes gateway 1340, cloud orchestration module 1341, host physical machine set 1342, virtual machine set 1343, and container set 1344.

Computer 1301 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1330. As is well understood in the art of computer technology, and depending upon the technology, performance of a computer-implemented method may be distributed among multiple computers and/or between multiple locations. On the other hand, in this presentation of computing environment 1300, detailed discussion is focused on a single computer, specifically computer 1301, to keep the presentation as simple as possible. Computer 1301 may be located in a cloud, even though it is not shown in a cloud in FIG. 13. On the other hand, computer 1301 is not required to be in a cloud except to any extent as may be affirmatively indicated.

Processor set 1310 includes one, or more, computer processors of any type now known or to be developed in the future. Processing circuitry 1320 may be distributed over multiple packages, for example, multiple, coordinated integrated circuit chips. Processing circuitry 1320 may implement multiple processor threads and/or multiple processor cores. Cache 1321 is memory that is located in the processor chip package(s) and is typically used for data or code that should be available for rapid access by the threads or cores running on processor set 1310. Cache memories are typically organized into multiple levels depending upon relative proximity to the processing circuitry. Alternatively, some, or all, of the cache for the processor set may be located "off chip." In some computing environments, processor set 1310 may be designed for working with qubits and performing quantum computing.

Computer readable program instructions are typically loaded onto computer 1301 to cause a series of operational steps to be performed by processor set 1310 of computer 1301 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1321 and the other storage media discussed below. The program instructions, and associated data, are accessed by processor set 1310 to control and direct performance of the inventive methods. In computing environment

1300, at least some of the instructions for performing the inventive methods may be stored in block 1350 in persistent storage 1313.

Communication fabric 1311 is the signal conduction paths that allow the various components of computer 1301 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1312 is any type of volatile memory now known or to be developed in the future. Examples include dynamic type random access memory (RAM) or static type RAM. Typically, the volatile memory is characterized by random access, but this is not required unless affirmatively indicated. In computer 1301, the volatile memory 1312 is located in a single package and is internal to computer 1301, but, alternatively or additionally, the volatile memory may be distributed over multiple packages and/or located externally with respect to computer 1301.

Persistent storage 1313 is any form of non-volatile storage for computers that is now known or to be developed in the future. The non-volatility of this storage means that the stored data is maintained regardless of whether power is being supplied to computer 1301 and/or directly to persistent storage 1313. Persistent storage 1313 may be a read only memory (ROM), but typically at least a portion of the persistent storage allows writing of data, deletion of data and re-writing of data. Some familiar forms of persistent storage include magnetic disks and solid state storage devices. Operating system 1322 may take several forms, such as various known proprietary operating systems or open source Portable Operating System Interface type operating systems that employ a kernel. The code included in block 1350 typically includes at least some of the computer code involved in performing the inventive methods.

Peripheral device set 1314 includes the set of peripheral devices of computer 1301. Data communication connections between the peripheral devices and the other components of computer 1301 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1323 may include components such as a display screen, speaker, microphone, wearable devices (such as goggles and smart watches), keyboard, mouse, printer, touchpad, game controllers, and haptic devices. Storage 1324 is external storage, such as an external hard drive, or insertable storage, such as an SD card. Storage 1324 may be persistent and/or volatile. In some embodiments, storage 1324 may take the form of a quantum computing storage device for storing data in the form of qubits. In embodiments where computer 1301 is required to have a large amount of storage (for example, where computer 1301 locally stores and manages a large database) then this storage may be provided by peripheral storage devices designed for storing very large amounts of data, such as a storage area network (SAN) that is shared by multiple, geographically distributed computers. IoT sensor set 1325 is made up of sensors that can be used in Internet of Things applications. For example, one sensor may be a thermometer and another sensor may be a motion detector.

Network module 1315 is the collection of computer software, hardware, and firmware that allows computer 1301 to communicate with other computers through WAN 1302. Network module 1315 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1315 are performed on the same physical hardware device. In other embodiments (for example, embodiments that utilize software-defined networking (SDN)), the control functions and the forwarding functions of network module 1315 are performed on physically separate devices, such that the control functions manage several different network hardware devices. Computer readable program instructions for performing the inventive methods can typically be downloaded to computer 1301 from an external computer or external storage device through a network adapter card or network interface included in network module 1315.

WAN 1302 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 1303 is any computer system that is used and controlled by an end user (for example, a customer of an enterprise that operates computer 1301), and may take any of the forms discussed above in connection with computer 1301. EUD 1303 typically receives helpful and useful data from the operations of computer 1301. For example, in a hypothetical case where computer 1301 is designed to provide a recommendation to an end user, this recommendation would typically be communicated from network module 1315 of computer 1301 through WAN 1302 to EUD 1303. In this way, EUD 1303 can display, or otherwise present, the recommendation to an end user. In some embodiments, EUD 1303 may be a client device, such as thin client, heavy client, mainframe computer, desktop computer and so on.

Remote server 1304 is any computer system that serves at least some data and/or functionality to computer 1301. Remote server 1304 may be controlled and used by the same entity that operates computer 1301. Remote server 1304 represents the machine(s) that collect and store helpful and useful data for use by other computers, such as computer 1301. For example, in a hypothetical case where computer 1301 is designed and programmed to provide a recommendation based on historical data, then this historical data may be provided to computer 1301 from remote database 1330 of remote server 1304.

Public cloud 1305 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1305 is performed by the computer hardware and/or software of cloud orchestration module 1341. The computing resources provided by public cloud 1305 are typically implemented by virtual computing environments that run on various computers making up the computers of host physical machine set 1342, which is the universe of physical computers in and/or available to public cloud 1305. The virtual computing environments (VCEs) typically take the form of virtual machines from virtual machine set 1343 and/or containers from container set 1344. It is understood that these VCEs may be stored as images and may be transferred among and between the various physical machine hosts, either as images or after instantiation of the VCE. Cloud orchestration module 1341 manages the transfer and storage of images, deploys new instantiations of VCEs and manages active instantiations of VCE deployments. Gateway 1340 is the collection of computer software, hardware, and firmware that allows public cloud 1305 to communicate through WAN 1302.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1306 is similar to public cloud 1305, except that the computing resources are only available for use by a single enterprise. While private cloud 1306 is depicted as being in communication with WAN 1302, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1305 and private cloud 1306 are both part of a larger hybrid cloud.

The computing environment described above is only one example of a computing environment to incorporate, perform and/or use one or more aspects of the present disclosure. Other examples are possible. Further, in one or more embodiments, one or more of the components/modules of FIG. 13 need not be included in the computing environment and/or are not used for one or more aspects of the present disclosure. Further, in one or more embodiments, additional and/or other components/modules can be used. Other variations are possible.

Figure 13:
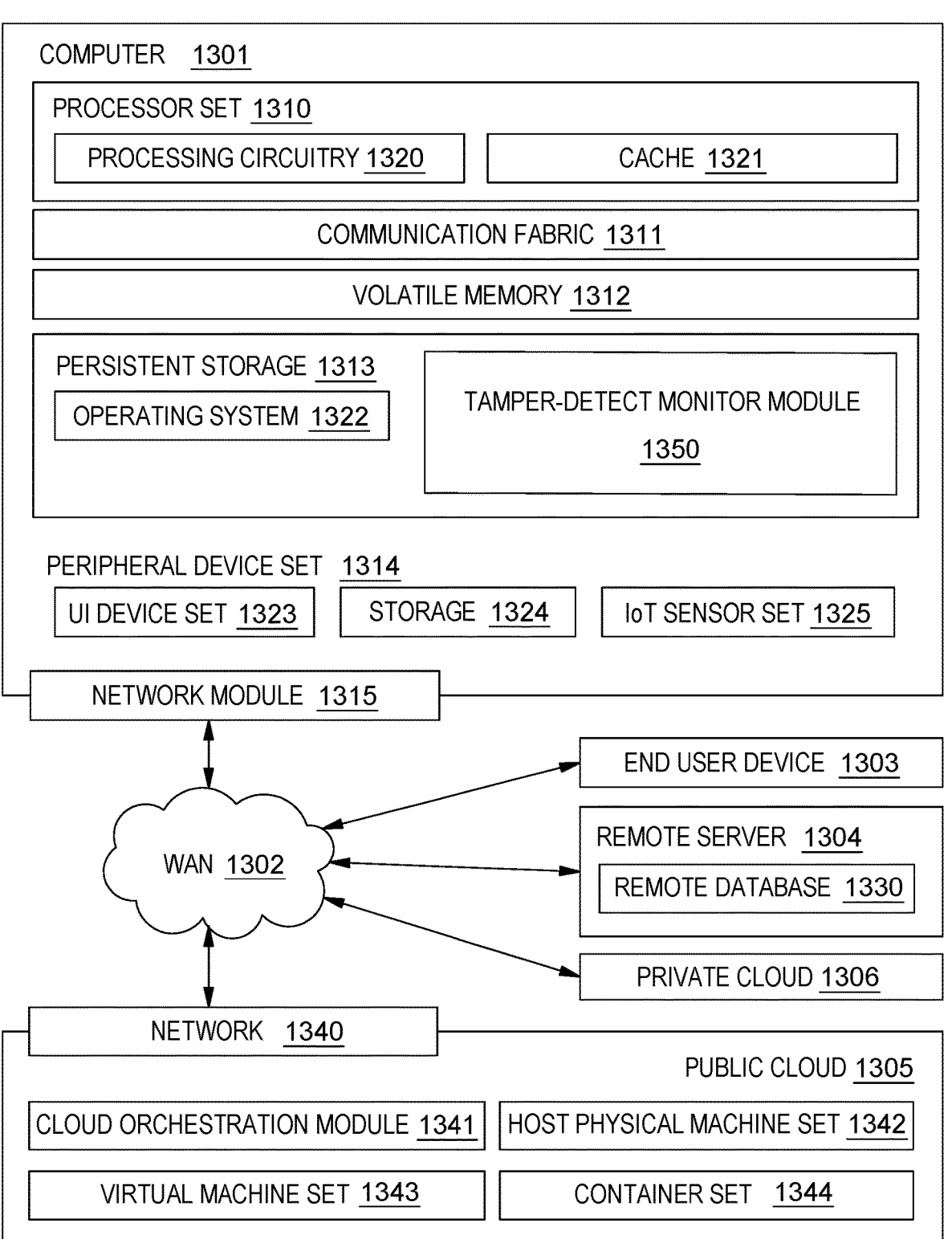
FIG. 13 depicts one example of a computing environment to include and/or use one or more aspects of the present disclosure.

The tamper-detect monitor module 1305 depicted in FIG. 13 can include, in one or more examples, various sub-modules used to perform processing, in accordance with one or more aspects of the present disclosure. The sub-modules can be, for instance, computer-readable program code (e.g., instructions) and computer-readable media (e.g., persistent storage (e.g., persistent storage 1313, such as a disc) and/or a cache (e.g., 1321), as examples). The computer-readable program code can be part of a computer program product and can be executed by and/or using one or more computers, such as computer(s) 1301; processors, such as a processor or processor set 1310; and/or processing circuitry, such as processor set 1310, etc.

In one example, the sub-modules of tamper-detect monitor module 1350 can include an obtain sensor data sub-module for obtaining the sensor data or signals, a compare sub-module for comparing the sensor signals to the stored chemical profile for the fluid within the secure volume, and a match profile sub-module to determine whether the sensor signals match the stored profile. If not, then an abnormal chemical concentration condition is detected, and a tamper-detect flag(s) can be set to initiate, for instance, erasure of any confidential data within the secure volume.

As noted, provided herein are tamper-respondent assemblies and methods of fabrication. In one or more embodiments, the tamper-respondent assemblies include a circuit board and an enclosure. The circuit board includes an electronic component, and the enclosure is mounted to the circuit board to enclose the electronic component within a secure volume, where the secure volume is a sealed space. In addition, the tamper-respondent assembly includes a fluid disposed within the secure volume. The fluid includes a chemical mixture with multiple chemical substances. The multiple chemical substances have randomly generated concentrations within the chemical mixture. In addition, the tamper-respondent assembly includes one or more sensors to facilitate detecting a change in the chemical mixture of the fluid within the secure volume indicative of a tamper event.

In one or more embodiments, the one or more sensors include one or more chemical sensors to facilitate detecting a change in concentration of a chemical substance of the multiple chemical substances of the chemical mixture of the fluid within the secure volume.

In one or more implementations, the tamper-respondent assembly includes multiple sensors to facilitate detecting the change in the chemical mixture of the fluid within the secure volume indicative of the tamper event. In an embodiment, the multiple sensors include, for instance, a chemical sensor to facilitate detecting a change in concentration of a chemical substance of the multiple chemical substances of the chemical mixture within the secure volume, a pressure sensor to facilitate detecting a change in a pressure within the secure volume, and a temperature sensor to facilitate detecting a change in temperature within the secure volume.

In one embodiment, the tamper-respondent assembly includes a sensor card disposed within the secure volume. The sensor card includes the multiple sensors to facilitate detecting the change in the chemical mixture of the fluid within the secure volume indicative of the tamper event. For instance, in one embodiment, the sensor card can have one main side and an opposite main side, with one or more sensors of the multiple sensors being disposed on the one main side of the sensor card, and one or more other sensors of the multiple sensors being disposed on the opposite main side of the sensor card.

In one or more embodiments, the tamper-respondent assembly includes a monitor component (or circuit) to monitor one or more sensor signals of the one or more sensors, where the monitor circuit compares the one or more sensor signals of the one or more sensors to stored data representative, at least in part, of an initial chemical mixture of the fluid within the secure volume to facilitate detecting the change in the chemical mixture of the fluid indicative of a tamper event. In one embodiment, the stored data further includes stored data relating the chemical mixture of the fluid within the secure volume to an initially determined pressure and temperature change profile of the fluid within the secure volume.

In one or more embodiments, the tamper-respondent assembly includes multiple enclosures mounted to the circuit board, where the enclosure mounted to the circuit board is one enclosure mounted to one side of the circuit board to enclose the electronic component within the secure volume, and the multiple enclosures further include another enclosure mounted to another side of the circuit board to enclose another electronic component within another secure volume. The one side of the circuit board and the other side of the circuit board are opposite sides of the circuit board. Further, a plurality of through-holes extend through the circuit board between the one side of the circuit board and the other side of the circuit board. The plurality of through-holes are provided to connect in fluid communication the secure volume and the other secure volume on the opposite sides of the circuit board.

In one or more embodiments, the multiple chemical substances having the randomly generated concentrations within the chemical mixture of the fluid include respective randomized partial pressures of the fluid within the secure volume, and the one or more sensors further facilitate detecting a change in a partial pressure of a chemical substance of the multiple chemical substances of the fluid within the secure volume.

In another aspect, a tamper-respondent assembly is provided which includes a fluid disposed within a sealed space of the tamper-respondent assembly to secure, at least in part, an electronic component. The fluid includes a chemical mixture with multiple chemical substances, and the multiple chemical substances have randomly generated concentrations within the chemical mixture. In addition, the tamper-respondent assembly includes one or more sensors to facilitate detecting a change in the chemical mixture of the fluid indicative of a tamper event into the sealed space of the tamper-respondent assembly.

In one or more embodiments, the tamper-respondent assembly includes multiple sensors to facilitate detecting the change in chemical mixture of the fluid within the sealed space indicative of a tamper event. The one or more sensors are one or more sensors of the multiple sensors, and the multiple sensors include a chemical sensor to facilitate detecting a change in concentration of a chemical substance of the multiple chemical substances of the chemical mixture within the sealed space. Further, in one embodiment, the multiple sensors further include a pressure sensor to facilitate detecting a change in a pressure within the sealed space, and a temperature sensor to facilitate detecting a change in temperature within the sealed space.

In a further aspect, a method of fabricating a tamper-respondent assembly is provided. The method includes obtaining a circuit board, where the circuit board includes an electronic component, and mounting an enclosure to the circuit board to enclose the electronic component within a secure volume. In addition, the method includes providing, via a fill port into the secure volume, a fluid within the secure volume. The fluid includes a chemical mixture with multiple chemical substances, where the multiple chemical substances have randomly generated concentrations within the chemical mixture. Further, the method of fabricating the tamper-respondent assembly includes providing one or more sensors to facilitate detecting the change in the chemical mixture of the fluid within the secure volume indicative of a tamper event.

In one or more embodiments, the method further includes mixing the fluid for providing into the secure volume, where mixing the fluid includes filling a mixing reservoir with the multiple chemical substances via respective mass flow controllers, where a flow rate of a chemical substance of the multiple chemical substances through a respective mass flow controller is set by a respective random number. In addition, the mixing of the fluid includes filling the mixing reservoir with the multiple chemical substances for a set time interval.

In one or more embodiments, the method includes initially measuring, by the one or more sensors, a concentration of each chemical substance of the multiple chemical substances of the chemical mixture of the fluid within the secure volume, and storing, as stored data, values of the initially measured concentrations of the multiple chemical substances of the fluid within the secure volume.

In one or more embodiments, the method further includes providing a monitor component to monitor one or more sensor signals of the one or more sensors. The monitor component compares one or more sensor signals of the one or more sensors to the stored data including the values of the initially measured concentrations of the multiple chemical substances of the fluid within the secure volume to facilitate detecting the change in the chemical mixture of the fluid indicative of the tamper event.

In one or more embodiments, the method includes providing multiple sensors to facilitate detecting the change in the chemical mixture of the fluid within the secure volume indicative of the tamper event, where the multiple sensors include a chemical sensor to facilitate detecting a change in concentration of a chemical substance of the multiple chemical substances of the chemical mixture within the secure volume. In one embodiment, the multiple sensors further include a pressure sensor to facilitate detecting a change in a pressure within the secure volume, and a temperature sensor to facilitate detecting a change in temperature within the secure volume.

In one or more embodiments, the method further includes providing a sensor card disposed within the secure volume, where the sensor card includes the multiple sensors to facilitate detecting the change in the chemical mixture of the fluid within the secure volume indicative of the tamper event.

In one or more embodiments, the multiple chemical substances having the randomly generated concentrations within the chemical mixture of the fluid include respective randomized partial pressures of the fluid within the secure volume, and the one or more sensors further facilitate detecting a change in a partial pressure of a chemical substance of the multiple chemical substances of the chemical mixture of the fluid within the secure volume.

Advantageously, a tamper-respondent assembly, such as a sealed hardware security module, is provided herein which can use both chemical and pressure sensing, and unique chemical ratios that are intrinsically measured and stored within the assembly to prevent undetected access to the secure volume containing, for instance, internal secure cryptographic components, where the attempted access results in disturbing the secure volume with a change in the chemical concentration and/or pressure of the chemical substances in the chemical mixture. In one or more embodiments, sensitivity to unauthorized intrusion or tampering is facilitated using a series of through-holes in the multilayer circuit board, and/or provision of a sensor card or sensor sub-assembly disposed within one of the secure volumes of the tamper-respondent assembly.

In one embodiment, a tamper-proof electronic package or tamper-respondent assembly is provided, utilizing one or more chemical markers within the secure volume. The chemical markers include inert media that are filled into the secure volume, and the chemical markers have a randomized ratio known only to the electronic devices inside the filled enclosure. Further, in one embodiment, the chemical marker of a substance within the sealed space is pressurized to a randomized pressure known only to the monitor component inside the filled enclosure. In one or more embodiments, a system to randomize the concentration of the pressure of the chemical markers of the fill media is provided, which includes or utilizes an electronic random number generator driving the behavior of one or more mass flow controllers for the chemical marker. In one embodiment, the tamper-respondent assembly includes sensors or detectors to monitor the chemical marker(s), and the pressure and temperature within the sealed space. These detectors record the initial pressures and ratios of the chemical markers in the media, and store this information in internal memory within the secure volume. A manufacturing process is provided to calibrate and store the unique chemical signature, and its relation or profile with pressure and temperature is obtained for future reference to prevent false tamper detection. In one or more embodiments, the monitor component or circuit includes an algorithm or logic that enables tamper detection by monitoring the chemical sensor signals in the secure volume, and comparing the sensor signals to the stored chemical mixture signature.

In one or more embodiments, the tamper-respondent assemblies monitor the chemical marker(s) and pressure such that an electronic tamper signal is generated if an intrusion event into the secure volume is detected through a change in chemical concentration and/or pressure within the secure volume.

In one embodiment, the tamper-respondent assembly includes a structure that enables the sensing including, for instance, one or more card-mounted sensors provided on the multilayer circuit board within the secure volume, and the inclusion of a pattern of through-holes through the circuit board to provide a mechanism for fluid exchange between multiple secure volumes defined on different sides of the circuit board. In one or more embodiments, the sensors and/or sensor card can be placed near sensitive areas of the enclosure, improving sensitivity to unauthorized alterations in the chemical mixture and/or pressure. In one embodiment, the sensor card or sensors can be provided near the perimeter of the secure volume, and mechanically affixed and electrically connected through an interconnect and/or mechanical retention structure, such as threaded fasteners.

In one or more embodiments, a tamper-respondent assembly or apparatus is provided which includes a tamper-proof sealed secure volume within the assembly. The tamper-respondent assembly includes the sealed space, such as the secure volume, with a chemical sensor and a pressure sensor being disposed within the volume configured to detect, for facilitate detecting, a chemical concentration change and/or pressure change for a gas and/or liquid disposed within the sealed space. In one embodiment, access to the secure volume can be via a sealable fill port for injecting the fluid (e.g., gas and/or liquid) into the sealed space. In accordance with one or more aspects disclosed herein, the concentration of chemical substances within the chemical mixture of the fluid is based on respective randomized values.

The terminology used herein is for the purpose of describing particular embodiments only and is not intended to be limiting of the disclosure. As used herein, the singular forms "a", "and" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A tamper-respondent assembly comprising:
a circuit board, the circuit board including an electronic component;
an enclosure mounted to the circuit board to enclose the electronic component within a secure volume, the secure volume being a sealed space;
a fluid disposed within the secure volume, the fluid comprising a chemical mixture of multiple different chemical substances, the multiple different chemical substances having randomly generated concentrations within the chemical mixture unique to the tamper-respondent assembly;
one or more sensors to facilitate detecting a change in the chemical mixture of the fluid within the secure volume indicative of a tamper event; and
a monitor component to monitor one or more sensor signals of the one or more sensors, the monitor component comparing the one or more sensor signals to stored data representative of initially measured random concentrations of the multiple chemical substances of the chemical mixture within the secure volume unique to the tamper-respondent assembly to facilitate detecting the change in the chemical mixture of the fluid indicative of the tamper event.

2. The tamper-respondent assembly of claim 1, wherein the one or more sensors comprise one or more chemical sensors to facilitate detecting a change in concentration of a chemical substance of the multiple chemical substances of the chemical mixture of the fluid within the secure volume, and wherein the multiple different chemical substances comprise multiple different gases within the secure volume.

3. The tamper-respondent assembly of claim 1, further comprising multiple sensors to facilitate detecting the change in the chemical mixture of the fluid within the secure volume indicative of the tamper event, the one or more sensors being one or more sensors of the multiple sensors, and wherein the multiple sensors include a chemical sensor to facilitate detecting a change in concentration of a chemical substance of the multiple different chemical substances of the chemical mixture within the secure volume, a pressure sensor to facilitate detecting a change in a pressure within the secure volume, and a temperature sensor to facilitate detecting a change in temperature within the secure volume.

4. The tamper-respondent assembly of claim 3, further comprising a sensor card disposed within the secure volume, the sensor card comprising the multiple sensors to facilitate detecting the change in the chemical mixture of the fluid within the secure volume indicative of the tamper event.

5. The tamper-respondent assembly of claim 4, wherein the sensor card has one main side and an opposite main side, and wherein one or more sensors of the multiple sensors are disposed on the one main side of the sensor card, and one or more other sensors of the multiple sensors are disposed on the opposite main side of the sensor card.

6. The tamper-respondent assembly of claim 1, wherein the stored data further comprises stored data relating the chemical mixture of the fluid within the secure volume to a determined pressure and temperature change profile of the fluid within the secure volume.

7. The tamper-respondent assembly of claim 1, further comprising:
multiple enclosures mounted to the circuit board, the enclosure mounted to the circuit board being one enclosure mounted to one side of the circuit board to enclosure the electronic component within the secure volume, and the multiple enclosures further comprising another enclosure mounted to another side of the circuit board to enclose another electronic component within another secure volume, the one side of the circuit board and the other side of the circuit board being opposite sides of the circuit board;
a plurality of through-holes extending through the circuit board between the one side of the circuit board and the other side of the circuit board, the plurality of through-holes connecting in fluid communication the secure volume and the other secure volume on the opposite sides of the circuit board.

8. The tamper-respondent assembly of claim 1, wherein the multiple different chemical substances having the randomly generated concentrations within the chemical mixture of the fluid comprise respective randomized partial pressures of the fluid within the secure volume, and wherein the one or more sensors further facilitate detecting a change in a partial pressure of a chemical substance of the multiple different chemical substances of the chemical mixture of the fluid within the secure volume.

9. A tamper-respondent assembly comprising:
a fluid disposed within a sealed space of the tamper-respondent assembly to secure, at least in part, an electronic component, the fluid comprising a chemical mixture with multiple distinct chemical substances, the multiple distinct chemical substances having randomly generated concentrations within the chemical mixture unique to the tamper-respondent assembly;

one or more sensors to facilitate detecting a change in the chemical mixture of the fluid indicative of a tamper event into the sealed space of the tamper-respondent assembly; and a monitor component to monitor one or more sensor signals of the one or more sensors, the monitor component comparing the one or more sensor signals to stored data representative of initially measured random concentrations of the multiple chemical substances of the chemical mixture within the secure volume unique to the tamper-respondent assembly to facilitate detecting the change in the chemical mixture of the fluid indicative of the tamper event.

10. The tamper-respondent assembly of claim 9, further comprising multiple sensors to facilitate detecting the change in the chemical mixture of the fluid within the sealed space indicative of the tamper event, the one or more sensors being one or more sensors of the multiple sensors, and wherein the multiple sensors comprise a chemical sensor to facilitate detecting a change in concentration of a chemical substance of the multiple distinct chemical substances of the chemical mixture within the sealed space.

11. The tamper-respondent assembly of claim 10, wherein the multiple sensors further include a pressure sensor to facilitate detecting a change in a pressure within the sealed space, and a temperature sensor to facilitate detecting a change in temperature within the sealed space.

12. A method of fabricating a tamper-respondent assembly, the method comprising:

obtaining a circuit board, the circuit board including an electronic component;

mounting an enclosure to the circuit board to enclose the electronic component within a secure volume;

providing, via a fill port into the secure volume, a fluid within the secure volume, the fluid comprising a chemical mixture with multiple different chemical substances, the multiple different chemical substances having randomly generated concentrations within the chemical mixture unique to the tamper-respondent assembly;

providing one or more sensors to facilitate detecting a change in the chemical mixture of the fluid within the secure volume indicative of a tamper event; and providing a monitor component to monitor one or more sensor signals of the one or more sensors, the monitor component comparing the one or more sensor signals to stored data representative of initially measured random concentrations of the multiple chemical substances of the chemical mixture within the secure volume unique to the tamper-respondent assembly to facilitate detecting the change in the chemical mixture of the fluid indicative of the tamper event.

13. The method of claim 12, further comprising mixing the fluid for providing into the secure volume, wherein mixing the fluid comprises:

filling a mixing reservoir with the multiple chemical substances via respective mass flow controllers, wherein a flow rate of a chemical substance of the multiple different chemical substances through a respective mass flow controller is set by a respective random number; and wherein the filling of the mixing reservoir with the multiple different chemical substances is for a set time interval.

14. The method of claim 13, further comprising initially measuring, by the one or more sensors, concentration of each chemical substance of the multiple different chemical substances of the chemical mixture of the fluid within the secure volume, and storing, as the stored data, values of the initially measured concentrations of the multiple different chemical substances of the fluid within the secure volume.

15. The method of claim 12, further comprising providing multiple sensors to facilitate detecting the change in the chemical mixture of the fluid within the secure volume indicative of the tamper event, the one or more sensors being one or more sensors of the multiple sensors, and wherein the multiple sensors include a chemical sensor to facilitate detecting a change in concentration of a chemical substance of the multiple different chemical substances of the chemical mixture within the secure volume.

16. The method of claim 15, wherein the multiple sensors further include a pressure sensor to facilitate detecting a change in a pressure within the secure volume, and a temperature sensor to facilitate detecting a change in temperature within the secure volume.

17. The method of claim 15, further comprising providing a sensor card disposed within the secure volume, the sensor card comprising the multiple sensors to facilitate detecting the change in the chemical mixture of the fluid within the secure volume indicative of the tamper event.

18. The method of claim 12, wherein the multiple different chemical substances having the randomly generated concentrations within the chemical mixture of the fluid comprise respective randomized partial pressures of the fluid within the secure volume, and wherein the one or more sensors further facilitate detecting a change in a partial pressure of a chemical substance of the multiple chemical substances of the chemical mixture of the fluid within the secure volume.

\* \* \* \* \*